United States Patent
Chang et al.

(10) Patent No.: US 11,223,333 B2
(45) Date of Patent: Jan. 11, 2022

(54) MICROWAVE AMPLIFICATION CIRCUIT

(71) Applicant: ELECTRONICS AND TELECOMMUNICATIONS RESEARCH INSTITUTE, Daejeon (KR)

(72) Inventors: Woojin Chang, Daejeon (KR); Seong-Il Kim, Daejeon (KR); Sang-Heung Lee, Daejeon (KR); Jongmin Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 56 days.

(21) Appl. No.: 16/941,691

(22) Filed: Jul. 29, 2020

(65) Prior Publication Data

US 2021/0083632 A1    Mar. 18, 2021

(30) Foreign Application Priority Data

Sep. 17, 2019  (KR) .......................... 10-2019-0113984

(51) Int. Cl.
  *H03F 1/56*  (2006.01)
  *H03F 3/19*  (2006.01)
  *H03G 3/30*  (2006.01)

(52) U.S. Cl.
  CPC ................. *H03F 1/56* (2013.01); *H03F 3/19* (2013.01); *H03G 3/3036* (2013.01); *H03F 2200/222* (2013.01); *H03F 2200/387* (2013.01); *H03G 2201/103* (2013.01)

(58) Field of Classification Search
  CPC ........ H03F 1/56; H03F 3/19; H03F 2200/222; H03F 2200/387; H03G 3/3036; H03G 2201/103

USPC ......................................................... 330/284
See application file for complete search history.

(56) References Cited

U.S. PATENT DOCUMENTS

| 3,643,173 | A | * | 2/1972 | Whitten | ............... H03H 11/126 330/253 |
| 4,392,225 | A | * | 7/1983 | Wortman | ................... H04J 1/10 370/492 |
| 5,089,790 | A | | 2/1992 | Mochizuki et al. | |
| 8,587,224 | B1 | | 11/2013 | Kim et al. | |

(Continued)

FOREIGN PATENT DOCUMENTS

KR          101983162 B1     5/2019

*Primary Examiner* — Hafizur Rahman
(74) *Attorney, Agent, or Firm* — Rabin & Berdo, P.C.

(57) ABSTRACT

Provided is an amplification circuit for amplifying an input signal. The amplification circuit includes an input stage including an input matching circuit that receives the input signal and an input attenuation circuit that attenuates a gain for the input signal outside an operating frequency band of the amplification circuit, a transistor that amplifies the input signal provided from the input stage, and an output stage including an output matching circuit that receives a signal amplified by the transistor and an output attenuation circuit that attenuates the gain for the input signal outside the operating frequency band of the amplification circuit, and the input attenuation circuit includes a first resistor and a second resistor that are connected to a ground voltage, a first passive element connected between the input matching circuit and the second resistor, and a second passive element connected between the first passive element and the first resistor.

14 Claims, 20 Drawing Sheets

(56) References Cited

U.S. PATENT DOCUMENTS

| | | |
|---|---|---|
| 9,160,285 B2 | 10/2015 | Seong |
| 9,543,898 B2 | 1/2017 | Tsuyama et al. |
| 9,716,475 B1 * | 7/2017 | Noori .................. H03F 3/195 |
| 2013/0194023 A1 * | 8/2013 | Ahmed .................. H03F 3/19 |
| | | 327/360 |
| 2015/0035595 A1 * | 2/2015 | Harwalkar ............ H03F 1/223 |
| | | 330/185 |
| 2019/0207567 A1 | 7/2019 | Kong et al. |
| 2020/0007095 A1 * | 1/2020 | Seshita .................. H03F 1/56 |
| 2020/0007102 A1 * | 1/2020 | Lee ...................... H03F 1/223 |

\* cited by examiner

MICROWAVE AMPLIFICATION CIRCUIT

CROSS-REFERENCE TO RELATED APPLICATIONS

This U.S. non-provisional patent application claims priority under 35 U.S.C. § 119 of Korean Patent Application No. 10-2019-0113984, filed on Sep. 17, 2019, the entire contents of which are hereby incorporated by reference.

BACKGROUND

Embodiments of the inventive concept relate to a microwave amplification circuit.

A microwave amplification circuit may be used in various communication systems such as a microwave wireless communication system, a radio frequency (RF) transmission/reception system, etc. The microwave amplification circuit may amplify an input signal by using both an active element and a passive element. The active element may be used to obtain a gain for the input signal, and the passive element may be used for an impedance matching.

The microwave amplification circuit may amplify the input signal within an operating frequency band, but may also amplify the input signal outside the operating frequency band. The amplification of the input signal outside the operating frequency band by the microwave amplification circuit may cause deterioration of a communication system and additional circuitry such as a filter.

SUMMARY

Embodiments according to the inventive concept provide a microwave amplification circuit.

According to an embodiment of the inventive concept, an amplification circuit for amplifying an input signal includes an input stage including an input matching circuit that receives the input signal and an input attenuation circuit that attenuates a gain for the input signal outside an operating frequency band of the amplification circuit, a transistor that amplifies the input signal provided from the input stage, and an output stage including an output matching circuit that receives a signal amplified by the transistor and an output attenuation circuit that attenuates the gain for the input signal outside the operating frequency band of the amplification circuit, and wherein the input attenuation circuit includes a first resistor and a second resistor that are connected to a ground voltage, a first passive element connected between the input matching circuit and the second resistor, and a second passive element connected between the first passive element and the first resistor, and wherein the first passive element is one of an inductor and a capacitor, and the second passive element is another one of the inductor and the capacitor.

According to another embodiment of the inventive concept, an amplification circuit includes a first amplification stage that receives an input signal, and a second amplification stage connected in series with the first amplification stage, and wherein the first amplification stage includes an input stage including an input matching circuit that receives the input signal and an input attenuation circuit that attenuates a gain for the input signal outside an operating frequency band of the amplification circuit, and a first transistor that amplifies the input signal provided from the input stage, wherein the input attenuation circuit includes a first resistor and a second resistor connected to a ground voltage, a first passive element connected between the input matching circuit and the second resistor, and a second passive element connected between the first passive element and the first resistor, and wherein the first passive element is one of an inductor and a capacitor, and the second passive element is another one of the inductor and the capacitor.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, embodiments of the inventive concept will be described clearly and in detail such that those skilled in the art may easily carry out the inventive concept.

Figure 1:
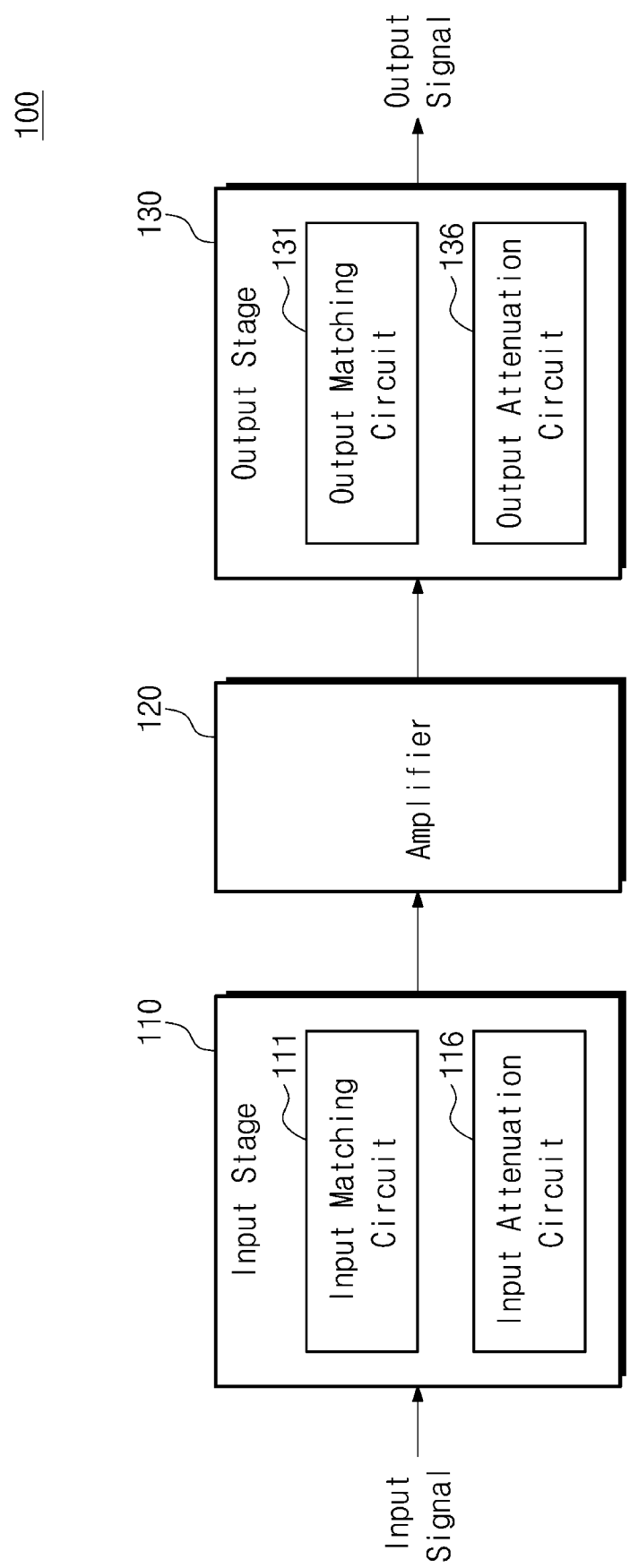
FIG. 1 is an exemplary block diagram of an amplification circuit according to an embodiment of the inventive concept.

FIG. 1 is an exemplary block diagram of an amplification circuit according to an embodiment of the inventive concept. An amplification circuit 100 may receive an input signal, may amplify the received input signal, and may output the amplified input signal as an output signal. For example, a frequency of the input signal may be 30 GHz or more, and the input signal may correspond to a microwave signal or a radio frequency (RF) signal. Referring to FIG. 1, the amplification circuit 100 may include an input stage 110, an amplifier 120, and an output stage 130.

The input stage 110 may receive an input signal from an outside of the amplification circuit 100 and may include an input matching circuit 111 and an input attenuation circuit 116. The input matching circuit 111 may receive the input signal and may match (or matching) an input impedance of the amplification circuit 100. For example, the input matching circuit 111 may include a transmission line, a microstrip line, a stub, etc. For another example, the input matching circuit 111 may include one or more passive elements such as an inductor, a capacitor, and a resistor.

The input attenuation circuit 116 may provide a relatively low impedance at a specific frequency. The input attenuation circuit 116 may attenuate (or reduce, or decrease) a degree of transmitting the input signal to the amplifier 120 at the specific frequency and may attenuate a gain for the input signal at the specific frequency. The gain for the input signal may represent a ratio (e.g., $S_{21}$) of the input signal to the output signal, which is a signal in which the input signal is amplified by the amplification circuit 100. The specific frequency described above may be located outside an operating frequency band of the amplification circuit 100. In addition, the input attenuation circuit 116 may attenuate the gain for the input signal even at a peripheral frequency of the specific frequency. The amplifier 120 described later may amplify the input signal within the operating frequency band of the amplification circuit 100 and may amplify the input signal outside the operating frequency band of the amplification circuit 100. The input attenuation circuit 116 may attenuate the gain for the input signal outside the operating frequency band of the amplification circuit 100.

The amplifier 120 may amplify the input signal that is transmitted (or provided) through the input stage 110. The amplifier 120 may transmit (or provide) the amplified signal to the output stage 130. For example, the amplifier 120 may include a transistor such as a bipolar junction transistor (BJT), a field effect transistor (FET), etc. The transistor may amplify the input signal.

The output stage 130 may receive the amplified signal transmitted from the amplifier 120 and may output the amplified signal as the output signal to the outside of the amplification circuit 100. The output stage 130 may include an output matching circuit 131 and an output attenuation circuit 136. The output matching circuit 131 may receive the amplified signal, may match an output impedance of the amplification circuit 100, and may be implemented similarly to the input matching circuit 111. The output attenuation circuit 136 may be implemented the same as or similar to the input attenuation circuit 116. The output attenuation circuit 136 may provide a relatively low impedance at a specific frequency. The specific frequency of the output attenuation circuit 136 and the specific frequency of the input attenuation circuit 116 may be the same as or different from each other. The output attenuation circuit 136 may attenuate the gain for the input signal outside the operating frequency band of the amplification circuit 100.

Referring to FIG. 1, the amplification circuit 100 may include both the input matching circuit 111 and the output matching circuit 131, and may include both the input attenuation circuit 116 and the output attenuation circuit 136. The number of input matching circuits 111 included in the input stage 110 may be one or more, the number of input attenuation circuits 116 included in the input stage 110 may be one or more, the number of output matching circuits 131 included in the output stage 130 may be one or more, and the number of output attenuation circuits 136 included in the output stage 130 may be one or more. Unlike illustrating of FIG. 1, the amplification circuit 100 may include only one of the input matching circuit 111 and the output matching circuit 131. In addition, the amplification circuit 100 may include only one of the input attenuation circuit 116 and the output attenuation circuit 136.

Figure 2:
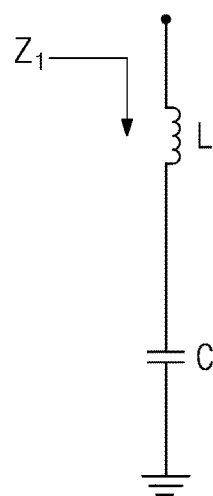
FIGS. 2 to 4 are exemplary circuit diagrams of an input attenuation circuit or an output attenuation circuit of FIG. 1.
Figure 3:
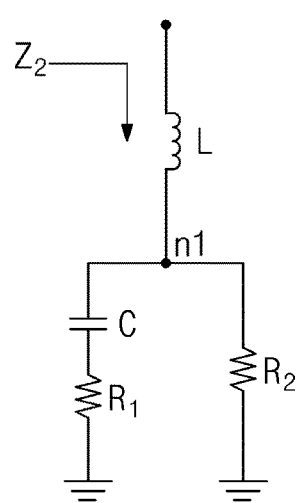
Figure 4:
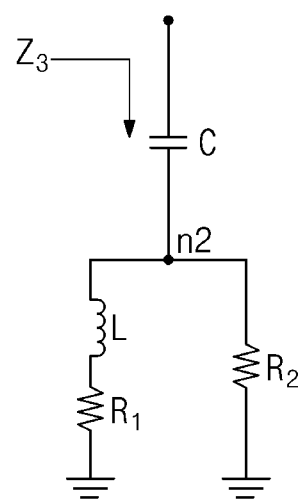

FIGS. 2 to 4 are exemplary circuit diagrams of an input attenuation circuit or an output attenuation circuit of FIG. 1. Attenuation circuits 116b to 116d may be an example of the input attenuation circuit 116 of FIG. 1, respectively. In addition, the attenuation circuits 116b to 116d may be an example of the output attenuation circuit 136 of FIG. 1, respectively.

One end of the attenuation circuit 116b may be connected to the input matching circuit 111 of the input stage 110 or may be connected to the amplifier 120. The other end of the attenuation circuit 116b may be connected to a ground voltage. The attenuation circuit 116b may include an inductor L and a capacitor C that are connected in series with each other. The inductor L and the capacitor C connected in series with each other may form an LC resonance circuit.

One end of the attenuation circuit 116c may be connected to the input matching circuit 111 of the input stage 110 or may be connected to the amplifier 120. The other end (or ends) of the attenuation circuit 116c may be connected to the ground voltage. The attenuation circuit 116c may include the inductor L, the capacitor C, a resistor $R_1$, and a resistor $R_2$. Here, the inductor L, the capacitor C, the resistor $R_1$, and the resistor $R_2$ may each correspond to the passive element. One end of the resistor $R_1$ and one end of the capacitor C may be connected in series with each other. The other end of the resistor $R_1$ may be connected to the ground voltage. One end of the resistor $R_2$ may be connected to a node n1 that is connected to the other end of the capacitor C and one end of the inductor L. The other end of the resistor $R_2$ may be connected to the ground voltage. The resistor $R_1$ and the capacitor C connected in series with each other, and the resistor $R_2$ may be connected in parallel between the node n1 and the ground voltage.

One end of the attenuation circuit 116d may be connected to the input matching circuit 111 of the input stage 110 or may be connected to the amplifier 120. The other end (or ends) of the attenuation circuit 116d may be connected to the ground voltage. The attenuation circuit 116d may include the inductor L, the capacitor C, the resistor $R_1$, and the resistor $R_2$. One end of the resistor $R_1$ and one end of the inductor L may be connected in series with each other. The other end of the resistor $R_1$ may be connected to the ground voltage. One end of the resistor $R_2$ may be connected to a node n2 that is connected to the other end of the inductor L and one end of the capacitor C. The other end of the resistor $R_2$ may be connected to the ground voltage. The resistor $R_1$ and the inductor L connected in series with each other, and the resistor $R_2$ may be connected in parallel between the node n2 and the ground voltage.

Equation 1 may represent an impedance $Z_1$ of the attenuation circuit 116b, Equation 2 may represent an impedance $Z_2$ of the attenuation circuit 116c, and Equation 3 may represent an impedance $Z_3$ of the attenuation circuit 116d.

$$Z_1 = j\omega\left(L - \frac{1}{\omega^2 C}\right) \quad \text{[Equation 1]}$$

$$Z_2 = \frac{R_2 + \omega^2 C^2 R_1 R_2 (R_1 + R_2)}{1 + \omega^2 C^2 (R_1 + R_2)^2} + j\omega\left(L - \frac{CR_2^2}{1 + \omega^2 C^2 (R_1 + R_2)^2}\right) \quad \text{[Equation 2]}$$

$$Z_3 = \frac{R_1 R_2 (R_1 + R_2) + \omega^2 L^2 R_2}{(R_1 + R_2)^2 + \omega^2 L^2} + j\omega\left(\frac{LR_2^2}{(R_1 + R_2)^2 + \omega^2 L^2} - \frac{1}{\omega^2 C}\right) \quad \text{[Equation 3]}$$

In Equations 1 to 3, L may represent an inductance of the inductor L, C may represent a capacitance of the capacitor C, $R_1$ may represent a resistance of the resistor $R_1$, and $R_2$ may represent the resistance of the resistor $R_2$.

Equation 4 may represent a resonance frequency $f_{r1}$ at which the imaginary part of the impedance $Z_1$ of the attenuation circuit 116b becomes 0, Equation 5 may represent a resonance frequency $f_{r2}$ at which the imaginary part of the impedance $Z_2$ of the attenuation circuit 116c becomes 0, and Equation 6 may represent a resonance frequency $f_{r3}$ at which the imaginary part of the impedance $Z_3$ of the attenuation circuit 116d becomes 0.

$$f_{r1} = \frac{1}{2\pi\sqrt{LC}} \qquad \text{[Equation 4]}$$

$$f_{r2} = \frac{1}{2\pi(R_1+R_2)}\sqrt{\frac{CR_2^2-L}{LC^2}} \qquad \text{[Equation 5]}$$

$$f_{r3} = \frac{R_1+R_2}{2\pi\sqrt{L(CR_2^2-L)}} \qquad \text{[Equation 6]}$$

Unlike the attenuation circuit 116b, the attenuation circuits 116c and 116d may further include the resistors $R_1$ and $R_2$. Referring to Equation 5 and Equation 6, the resistance of the resistor $R_2$ may be limited by the inductance of the inductor L and the capacitance of the capacitor C (e.g., $C·R_2^2-L>0$).

Referring to FIG. 2 and Equation 4, the attenuation circuit 116b may provide the impedance $Z_1$ that is theoretically zero at the resonance frequency $f_{r1}$. In practice, since the inductor L, the capacitor C, the transmission line, etc. may have parasitic resistance components, the impedance $Z_1$ at the resonance frequency $f_{r1}$ may be very small, but may not be zero. At the resonance frequency $f_{r1}$, most of the input signal may flow to the ground voltage through the attenuation circuit 116b, and the input signal may hardly be transmitted to the amplifier 120. The attenuation circuit 116b may attenuate the gain for the input signal at the resonance frequency $f_{r1}$ and the peripheral frequency of the resonance frequency $f_{r1}$. For example, the resonance frequency $f_{r1}$ that is determined based on the inductance of the inductor L and the capacitance of the capacitor C may be located outside the operating frequency band of the amplification circuit 100. To obtain the resonance frequency $f_{r1}$ lower than the operating frequency band, a relatively large inductor L and capacitor C may be required. To obtain the resonance frequency $f_{r1}$ higher than the operating frequency band, a relatively small inductor L and capacitor C may be required. When the gain for the input signal is attenuated by using the attenuation circuit 116b, a size of the inductor L and a size of the capacitor C may be restricted such that the resonance frequency $f_{r1}$ is located outside the operating frequency band. As described above, the attenuation circuit 116b provides the impedance $Z_1$ that is theoretically zero at the resonance frequency $f_{r1}$. Since a degree to which the gain of the input signal is attenuated at the resonance frequency $f_{r1}$ may be very large, the attenuation circuit 116b may attenuate the gain for the input signal not only outside the operating frequency band but also within the operating frequency band. Such gain attenuation is difficult to adjust even when the size of the inductor L or the capacitor C is adjusted.

Referring to FIG. 3, Equation 2, and Equation 5, the attenuation circuit 116c may provide an impedance $Z_2$ that is greater than the impedance $Z_1$ of the resonance frequency $f_{r1}$ at the resonance frequency $f_{r2}$ and corresponds to a real part of Equation 2. Compared to the attenuation circuit 116b, the impedance $Z_2$ at the resonance frequency $f_{r2}$ may be adjusted, varied, or changed by the resistances of the resistors $R_1$ and $R_2$. Since the impedance $Z_2$ at the resonance frequency $f_{r2}$ is adjusted by the resistances of the resistors $R_1$ and $R_2$, the degree to which the gain for the input signal is attenuated by the attenuation circuit 116c may also be adjusted by the resistances of the resistors $R_1$ and $R_2$.

Referring to FIG. 4, Equation 3, and Equation 6, the attenuation circuit 116d may provide the impedance $Z_3$ that is greater than the impedance $Z_3$ of the resonance frequency $f_{r1}$ at the resonance frequency $f_{r3}$ and corresponds to the real part of Equation 3. Compared to the attenuation circuit 116b, the impedance $Z_3$ at the resonance frequency $f_{r3}$ may be adjusted, varied, or changed by the resistances of the resistors $R_1$ and $R_2$. Since the impedance $Z_3$ at the resonance frequency $f_{r3}$ is adjusted by the resistances of the resistors $R_1$ and $R_2$, the degree to which the gain for the input signal is attenuated by the attenuation circuit 116d may also be adjusted by the resistances of the resistors $R_1$ and $R_2$.

Unlike the attenuation circuit 116b, each of the attenuation circuits 116c and 116d may include resistors $R_1$ and $R_2$. By adjusting the resistances of the resistors $R_1$ and $R_2$, the degree to which the gain for the input signal is attenuated may be adjusted by the attenuation circuits 116c and 116d. In addition, by adjusting the resistances of the resistors $R_1$ and $R_2$, the resonance frequencies $f_{r2}$ and $f_{r3}$ may be located outside the operating frequency band of the amplification circuit 100. Accordingly, size constraints of the inductor L and the capacitor C of the attenuation circuit 116b described above may be resolved or alleviated by the resistors $R_1$ and $R_2$. Compared to the attenuation circuit 116b, the degree to which the gain for the input signal is attenuated and the resonance frequencies $f_{r2}$ and $f_{r3}$ may be adjusted by adjusting the resistance of at least one of the resistors $R_1$ and $R_2$ of the attenuation circuits 116c and 116d.

For example, due to the resistors R1 and R2 of the impedances $Z_2$ and $Z_3$ of Equations 5 and 6, a frequency having a minimum impedance $Z_2$ may be similar to or different from the resonance frequency $f_{r2}$. A frequency having a minimum impedance $Z_3$ may be similar to or different from the resonance frequency $f_{r3}$. In contrast, a frequency having the smallest impedance $Z_1$ may be the resonance frequency $f_{r1}$.

Figure 5:
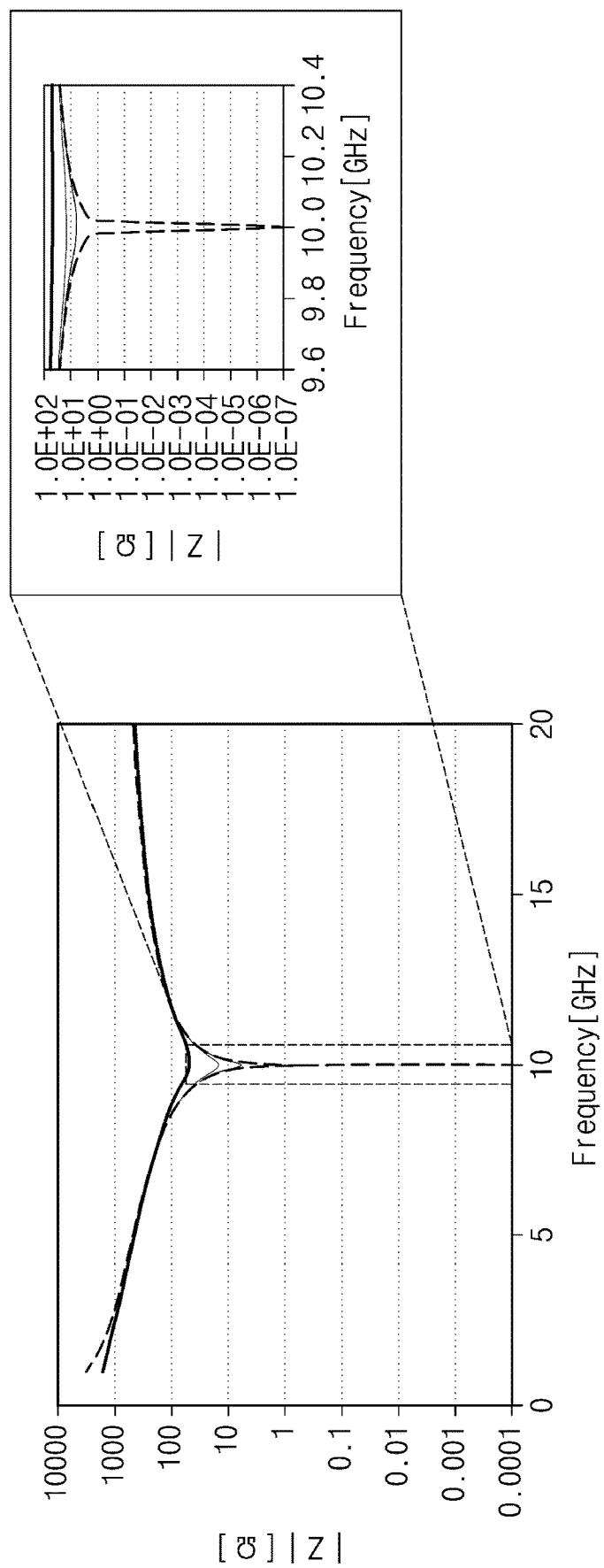
FIG. 5 is an exemplary graph of impedances of attenuation circuits of FIGS. 2 to 4.

FIG. 5 is an exemplary graph of impedances of attenuation circuits of FIGS. 2 to 4. A horizontal axis may represent a frequency, and a vertical axis may represent a magnitude of an impedance. In FIG. 5, the inductance of the inductor L is 5 nH, the capacitance of the capacitor C is 50 fF, the resistance of the resistor $R_1$ is 1Ω or 10Ω, and the resistance of the resistor $R_2$ may be 2 kΩ or 20 kΩ.

When the inductance of the inductor L is 5 nH and the capacitance of the capacitor C is 50 fF, the resonance frequency $f_{r1}$ is about 10 GHz and a magnitude $|Z_1|$ of an impedance at the resonance frequency $f_{r1}$ is about 1.3 E-7Ω. The magnitude $|Z_1|$ of an impedance at the resonance frequency $f_{r1}$ may be relatively less than the magnitude $|Z_1|$ of the impedance at different frequencies.

When the inductance of the inductor L is 5 nH, the capacitance of the capacitor C is 50 fF, the resistance of the resistor $R_1$ is 1Ω, and the resistance of the resistor $R_2$ is 2 kΩ, the resonance frequencies $f_{r2}$ and $f_{r3}$ may each be about 10 GHz, and the magnitudes $|Z_2|$ and $|Z_3|$ of the impedances at the resonance frequencies $f_{r2}$ and $f_{r3}$ may each be about 50Ω. When the inductance of the inductor L is 5 nH, the capacitance of the capacitor C is 50 fF, the resistance of the resistor $R_1$ is 10Ω, and the resistance of the resistor $R_2$ is 20 kΩ, the resonance frequencies $f_{r2}$ and $f_{r3}$ may each be about 10 GHz, and the magnitudes $|Z_2|$ and $|Z_3|$ of the impedances at the resonance frequencies $f_{r2}$ and $f_{r3}$ may each be about 15Ω. When the inductance of the inductor L is 5 nH, the capacitance of the capacitor C is 50 fF, the resistance of the resistor $R_1$ is 1Ω, and the resistance of the resistor $R_2$ is 20 kΩ2, the resonance frequencies $f_{r2}$ and $f_{r3}$ may each be about 10 GHz, and the magnitudes $|Z_2|$ and $|Z_3|$ of the impedances at the resonance frequencies $f_{r2}$ and $f_{r3}$ may each be about 6Ω. The magnitudes $|Z_2|$ and $|Z_3|$ of the impedances at the resonance frequencies $f_{r2}$ and $f_{r3}$ may be relatively less than the magnitudes $|Z_2|$ and $|Z_3|$ of the impedances at different frequencies.

The attenuation circuit 116b may provide the impedance $Z_1$ that is close to zero at the resonance frequency $f_{r1}$, most components of the input signal may flow to the ground voltage through the attenuation circuit 116b, and there are almost no components of the input signal transmitted to the amplifier 120. In contrast, when the resistances of the resistors $R_1$ and $R_2$ are adjusted, the attenuation circuits 116c and 116d may variously provide the magnitudes $|Z_2|$ and $|Z_3|$ of the impedances at resonance frequencies $f_{r2}$ and $f_{r3}$ to about 6 to 50Ω, may adjust an amount (magnitude) of the input signal flowing to the ground voltage through the attenuation circuit 116b and an amount (magnitude) of the input signal transferred to the amplifier 120. The attenuation circuits 116c and 116d may adjust the gain for the input signal, and may adjust the degree to which the gain for the input signal is attenuated.

Figure 6A:
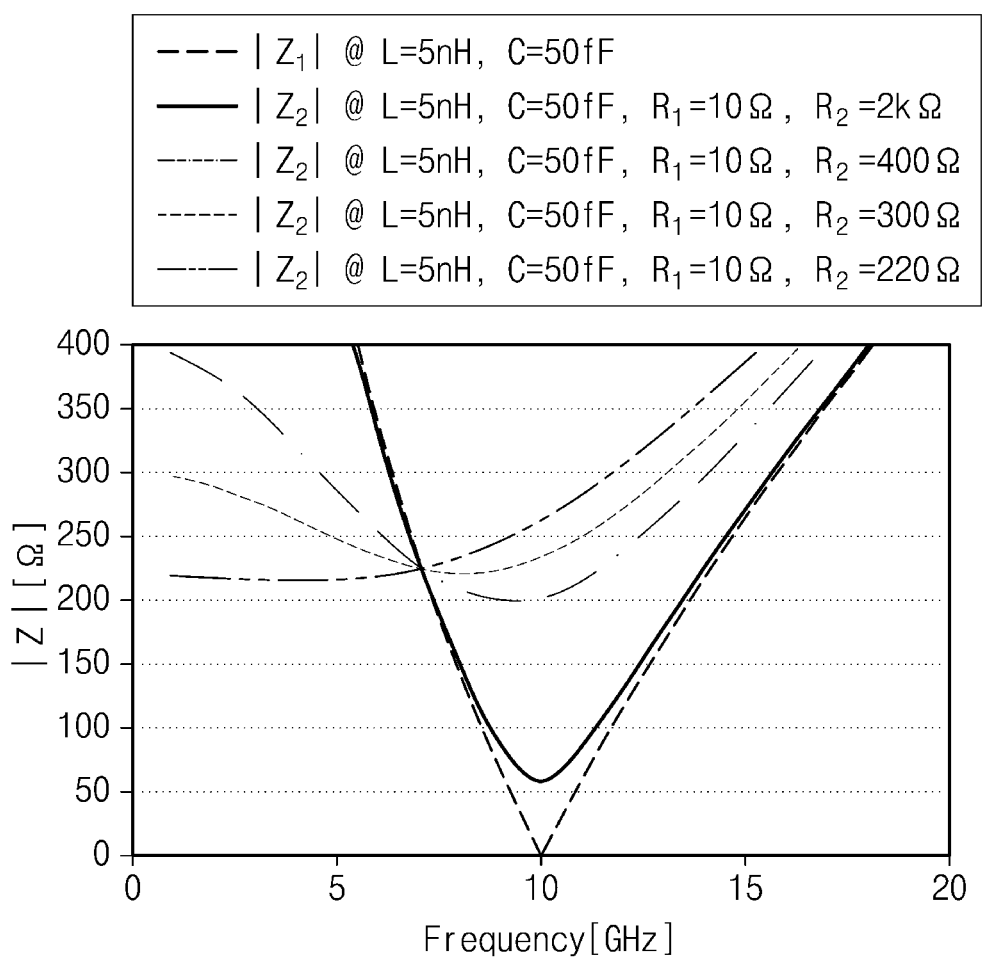
FIG. 6A is a graph illustrating a magnitude of an impedance of an attenuation circuit of FIG. 2 and a magnitude of an impedance of an attenuation circuit of FIG. 3.
Figure 6B:
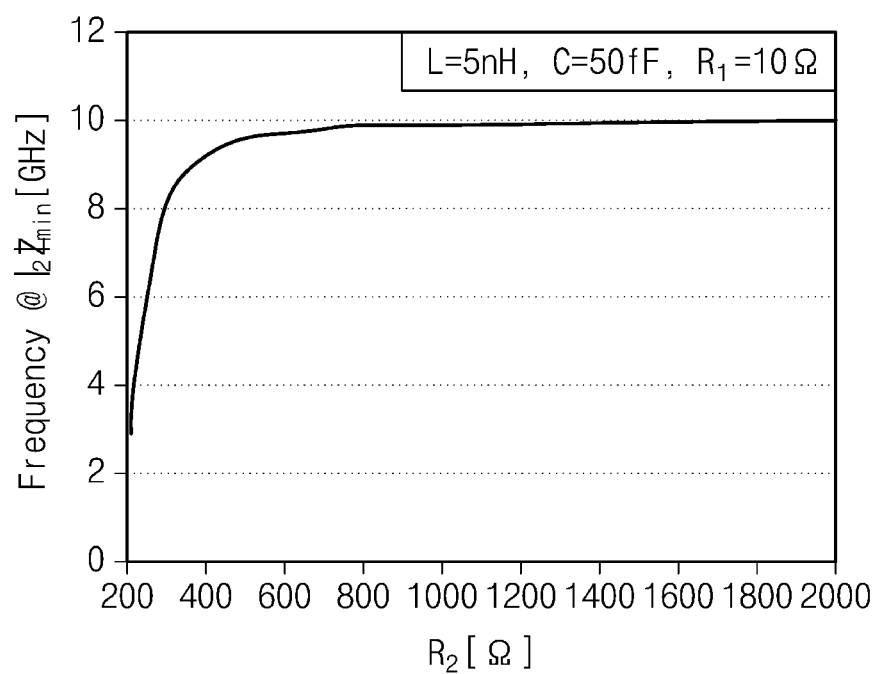
FIG. 6B is a graph of frequency in which an attenuation circuit of FIG. 3 has the smallest impedance magnitude.

FIG. 6A is a graph illustrating a magnitude of an impedance of an attenuation circuit of FIG. 2 and a magnitude of an impedance of an attenuation circuit of FIG. 3. A horizontal axis represents a frequency and a vertical axis represents a magnitude of an impedance. FIG. 6B is a graph of frequency in which an attenuation circuit of FIG. 3 has the smallest impedance magnitude. A horizontal axis represents the resistance of the resistor $R_2$, and a vertical axis represents a frequency.

Referring to FIG. 6A, when the inductance of the inductor L is 5 nH and the capacitance of the capacitor C is 50 fF, the resonance frequency $f_{r1}$ is about 10 GHz and a magnitude $|Z_1|$ of the impedance at the resonance frequency $f_{r1}$ may be close to zero. When the inductance of the inductor L is 5 nH, the capacitance of the capacitor C is 50 fF, the resistance of the resistor $R_1$ is 10Ω, and the resistance of the resistor $R_2$ is 2 kΩ, 400 Ω, 300Ω, and 220Ω, the attenuation circuit 116c may have various resonance frequencies $f_{r2}$ depending on the resistor $R_2$ and various impedance magnitudes $|Z_2|$. Referring to FIG. 6B, as the resistance of the resistor $R_2$ decreases, a frequency at which the magnitude $|Z_2|$ of the impedance is minimum or the resonance frequency $f_{r2}$ may also decrease.

Figure 7A:
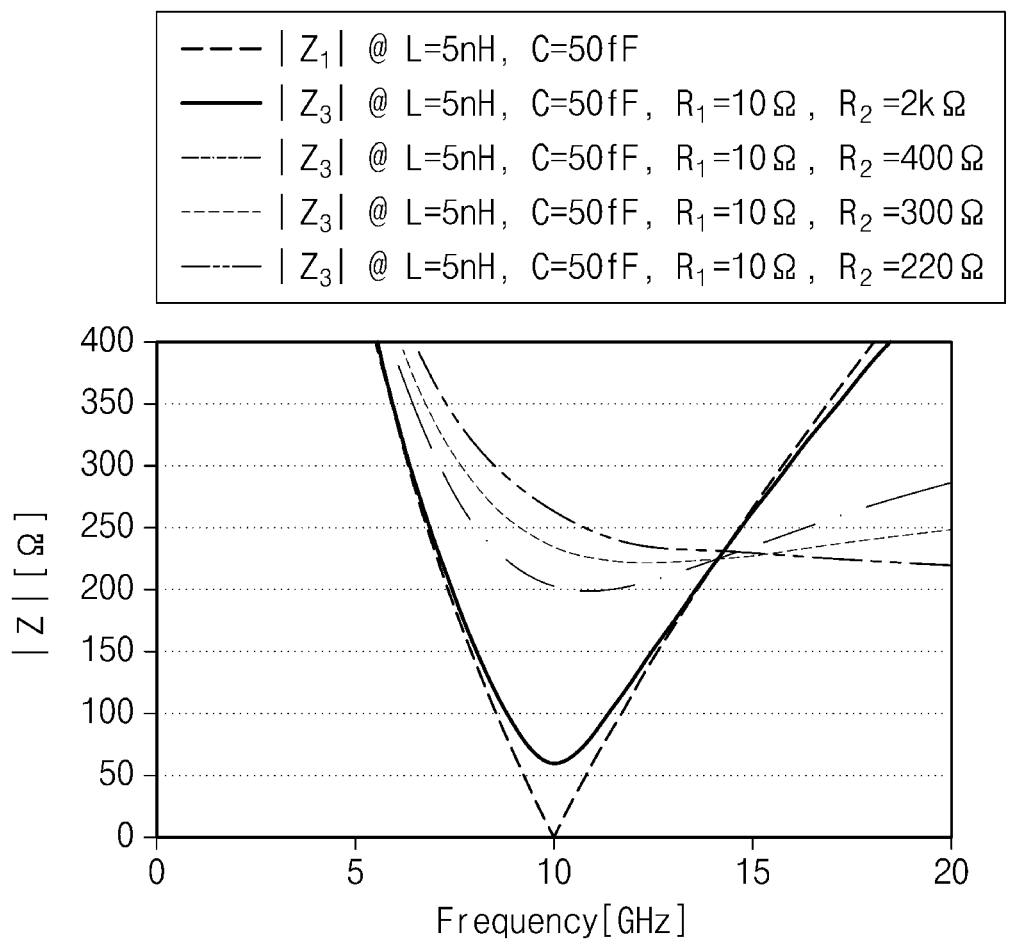
FIG. 7A is a graph illustrating a magnitude of an impedance of an attenuation circuit of FIG. 2 and a magnitude of an impedance of an attenuation circuit of FIG. 4.
Figure 7B:
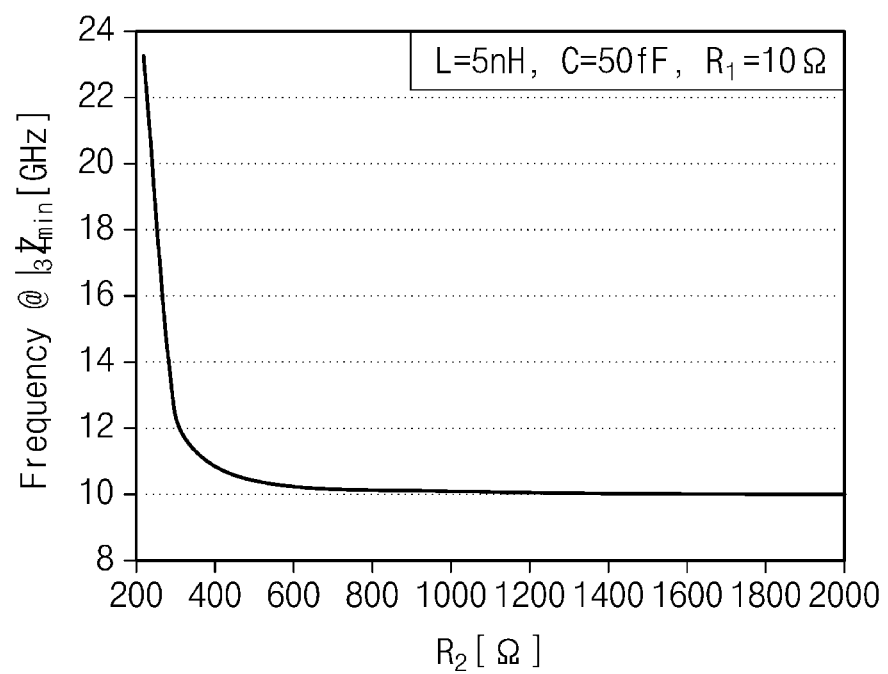
FIG. 7B is a graph of frequency in which an attenuation circuit of FIG. 4 has the smallest impedance magnitude.

FIG. 7A is a graph illustrating a magnitude of an impedance of an attenuation circuit of FIG. 2 and a magnitude of an impedance of an attenuation circuit of FIG. 4. A horizontal axis represents a frequency and a vertical axis represents a magnitude of an impedance. FIG. 7B is a graph of frequency in which an attenuation circuit of FIG. 4 has the smallest impedance magnitude. A horizontal axis represents the resistance of the resistor $R_2$, and a vertical axis represents a frequency.

Referring to FIG. 7A, when the inductance of the inductor L is 5 nH and the capacitance of the capacitor C is 50 fF, the resonance frequency $f_{r1}$ is about 10 GHz and the magnitude $|Z_1|$ of the impedance at the resonance frequency $f_{r1}$ may be close to zero. When the inductance of the inductor L is 5 nH, the capacitance of the capacitor C is 50 fF, the resistance of the resistor $R_1$ is 10Ω, and the resistance of the resistor $R_2$ is 2 kΩ, 400 Ω, 300Ω, and 220Ω, the attenuation circuit 116d may have various resonance frequencies $f_{r3}$ depending on the resistor $R_2$ and various impedance magnitudes $|Z_3|$. Referring to FIG. 7B, as the resistance of the resistor $R_2$ decreases, a frequency at which the magnitude $|Z_3|$ of the impedance is minimum or the resonance frequency $f_{r3}$ may also increase.

Various values in FIGS. 5 to 7B are presented by way of example, but the scope of the inventive concept is not limited to the above-described values.

FIGS. 8A to 8G are exemplary block diagrams of an amplification circuit of FIG. 1, respectively. Amplification circuits 100a to 100g of FIGS. 8A to 8G may be examples of the amplification circuit 100 of FIG. 1, respectively.

Figure 8A:
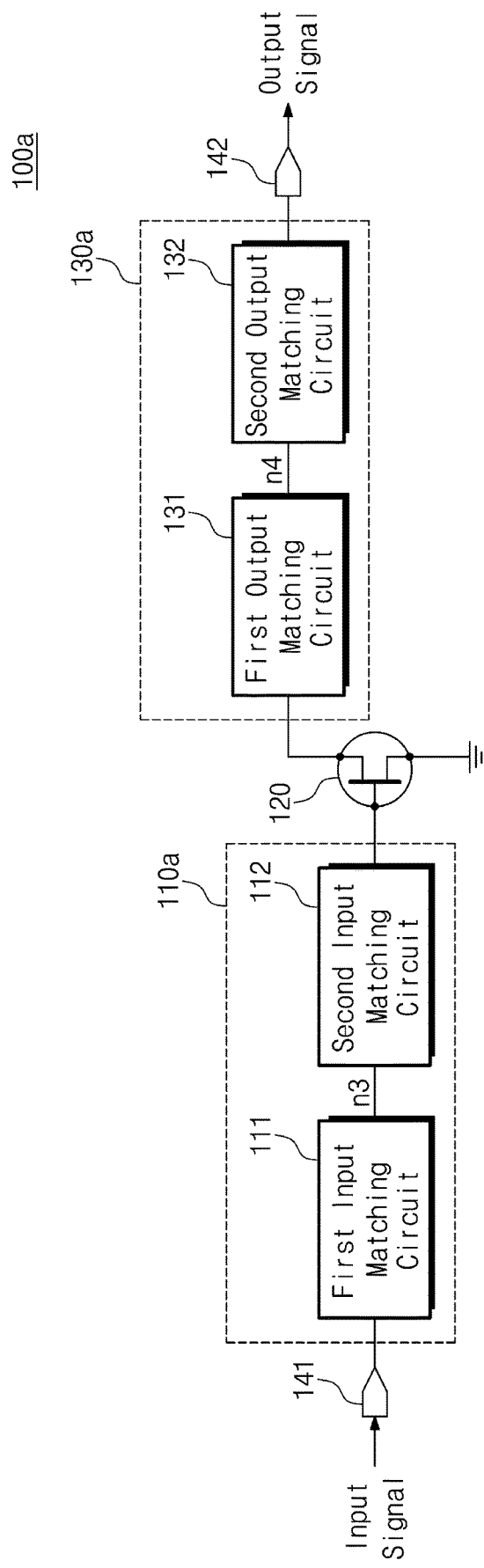
FIGS. 8A to 8G are exemplary block diagrams of an amplification circuit of FIG. 1, respectively.

Referring to FIG. 8A, the amplification circuit 100a may include an input stage 110a, the amplifier 120, an output stage 130a, an input terminal 141 receiving an input signal, and an output terminal 142 outputting an output signal. The amplification circuit 100a may not include the input attenuation circuit 116 and the output attenuation circuit 136 of FIG. 1.

The input stage 110a may include a first input matching circuit 111 connected between the input terminal 141 and a node n3 and a second input matching circuit 112 connected between the node n3 and the amplifier 120. Each of the first input matching circuit 111 and the second input matching circuit 112 may be substantially the same as the input matching circuit 111 of FIG. 1. The first input matching circuit 111 and the second input matching circuit 112 may be the same as or different from each other. The number of input matching circuits included in the input stage 110a is not limited to that illustrated in FIG. 8A and may be one or more. As described above in FIG. 1, the amplifier 120 may include a transistor. The transistor may include a terminal connected to the input stage 110a, a terminal connected to the ground voltage, and a terminal connected to the output stage 130a. The output stage 130a may include a first output matching circuit 131 connected between the amplifier 120 and a node n4 and a second output matching circuit 132 connected between the node n4 and the output terminal 142. Each of the first output matching circuit 131 and the second output matching circuit 132 may be substantially the same as the output matching circuit 131 of FIG. 1. The first output matching circuit 131 and the second output matching circuit 132 may be the same as or different from each other. The number of output matching circuits included in the output stage 130a is not limited to that illustrated in FIG. 8A and may be one or more.

Figure 8B:
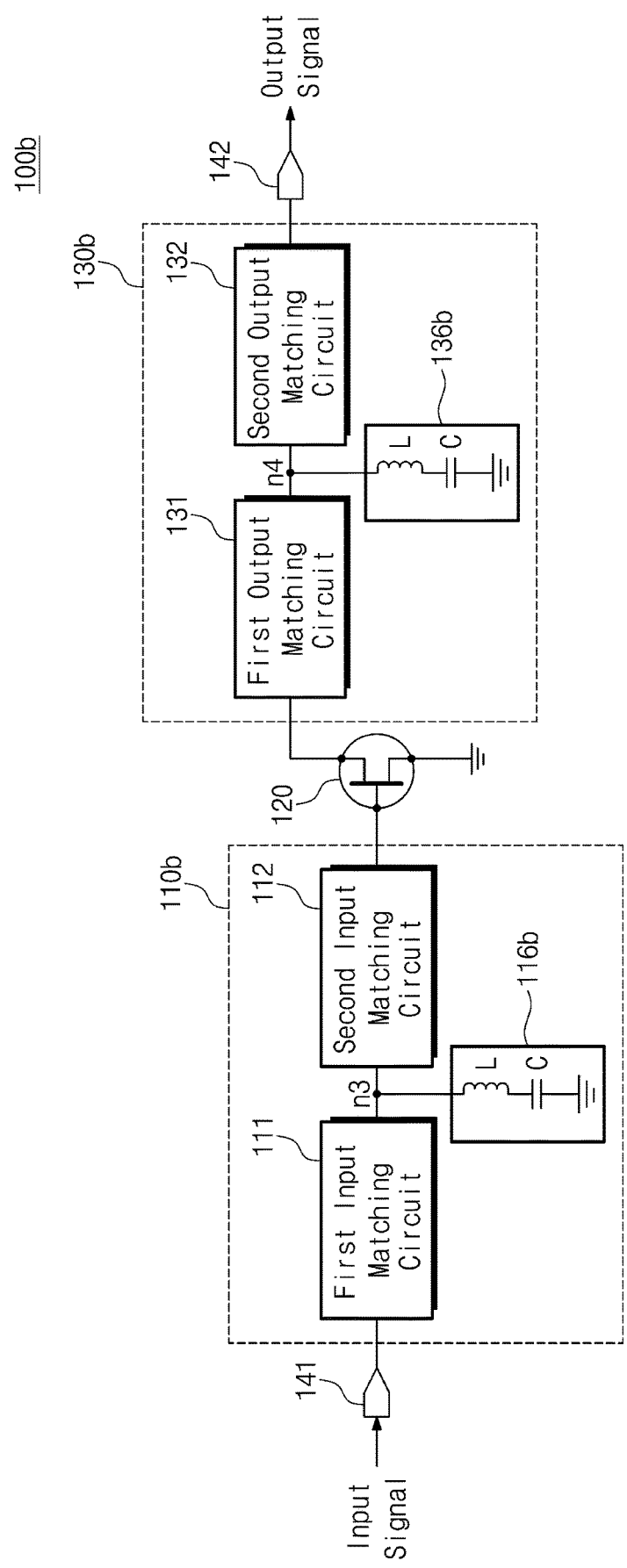

A difference between the amplification circuit 100b in FIG. 8B and the amplification circuit 100a in FIG. 8A will be mainly described. Compared to the amplification circuit 100a, an input stage 110b may further include the input attenuation circuit 116b, and an output stage 130b may further include an output attenuation circuit 136b. Each of the input attenuation circuit 116b and the output attenuation circuit 136b may be the attenuation circuit 116b of FIG. 2. The input attenuation circuit 116b may be connected between the node n3 and the ground voltage. The input attenuation circuit 116b may provide the above-described impedance $Z_1$ to the input signal that passes through the node n3 or the first input matching circuit 111. The output attenuation circuit 136b may be connected between the node n4 and the ground voltage. The output attenuation circuit 136b may provide the above-described impedance $Z_1$ to the amplified signal that passes through the node n4 or the first output matching circuit 131. The input attenuation circuit 116b and the output attenuation circuit 136b may attenuate the gain for the input signal outside the operating frequency band of the amplification circuit 100b, respectively. The amplification circuit 100b may attenuate the gain for the input signal to a maximum at a frequency at which the magnitude $|Z_1|$ of the impedance of the input attenuation circuit 116b is minimum, and the amplification circuit 100b may attenuate the gain of the input signal to a maximum at a frequency at which the magnitude $|Z_1|$ of the impedance of the output attenuation circuit 136b is minimum.

In an embodiment, the inductance of the input attenuation circuit 116b may be the same as or different from the inductance of the output attenuation circuit 136b. The capacitance of the input attenuation circuit 116b may be the same as or different from the capacitance of the output attenuation circuit 136b. The magnitude $|Z_1|$ of the impedance of the input attenuation circuit 116b may be the same as or different from the magnitude $|Z_1|$ of the impedance of the output attenuation circuit 136b. The frequency at which the magnitude $|Z_1|$ of the impedance of the input attenuation circuit 116b becomes minimum may be the same as or different from the frequency at which the magnitude $|Z_1|$ of the impedance of the output attenuation circuit 136b becomes minimum. The degree to which the gain for the input signal is attenuated by the input attenuation circuit 116b may be the same as or different from the degree to which the gain for the input signal is attenuated by the output attenuation circuit 136b.

Figure 8C:
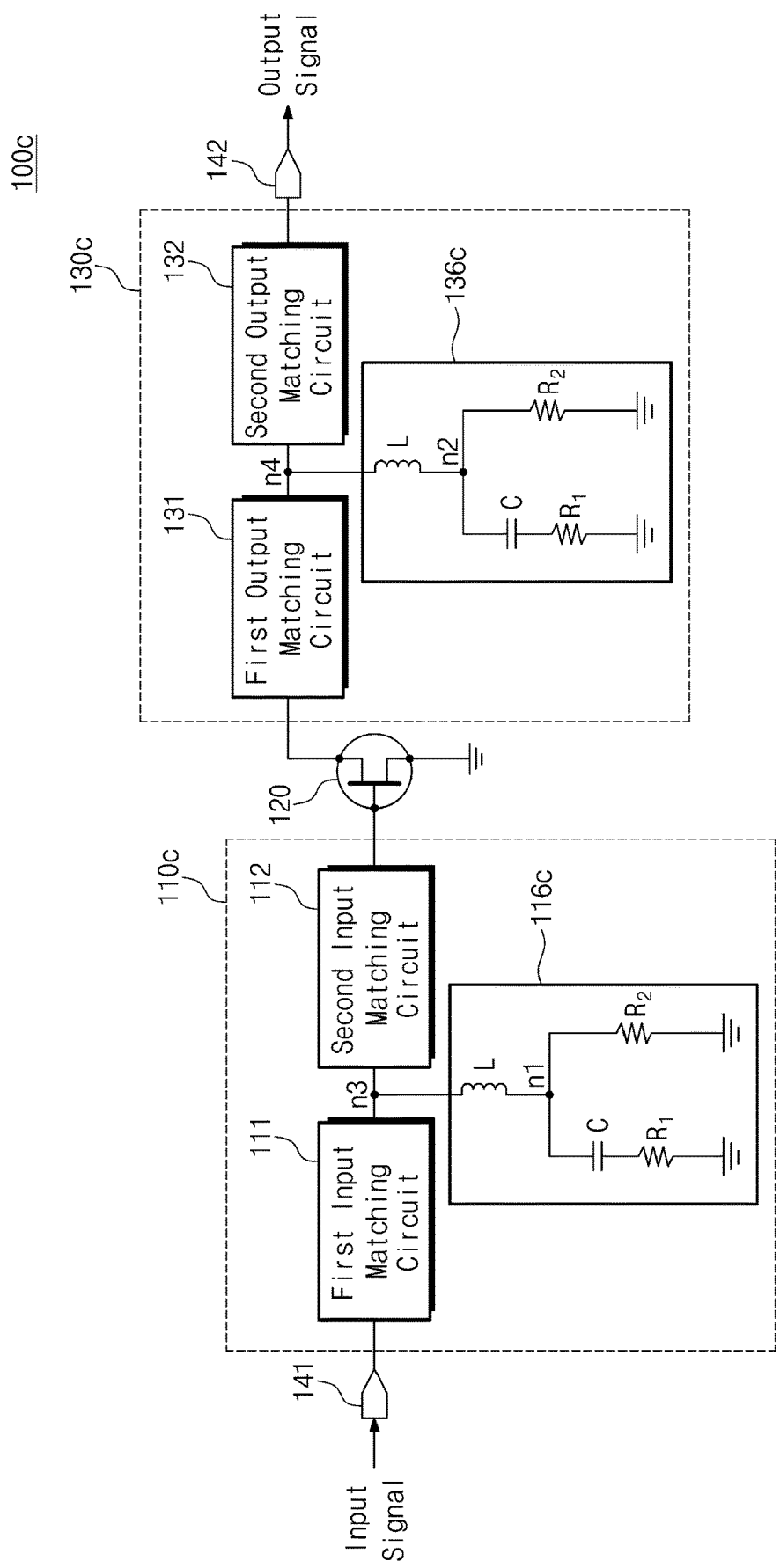

A difference between the amplification circuit 100c of FIG. 8C and the amplification circuit 100b of FIG. 8B will be mainly described. An input stage 110c may include the input attenuation circuit 116c instead of the input attenuation circuit 116b. An output stage 130c may include an output attenuation circuit 136c instead of the output attenuation circuit 136b. Each of the input attenuation circuit 116c and the output attenuation circuit 136c may be the attenuation circuit 116c of FIG. 3. The input attenuation circuit 116c may provide the above-described impedance $Z_2$ to the input signal that passes through the node n3 or the first input matching circuit 111. The output attenuation circuit 136c may provide the above-described impedance $Z_2$ to the amplified signal that passes through the node n4 or the first output matching circuit 131. The input attenuation circuit 116c and the output attenuation circuit 136c may attenuate the gain for the input signal outside the operating frequency band of the amplification circuit 100c, respectively. The amplification circuit 100c may attenuate the gain for the input signal to a maximum at the frequency at which the magnitude $|Z_2|$ of the impedance of the input attenuation circuit 116c becomes minimum, and the amplification circuit 100c may attenuate the gain of the input signal to a maximum at the frequency at which the magnitude $|Z_2|$ of the impedance of the output attenuation circuit 136c becomes minimum.

In an embodiment, the inductance of the input attenuation circuit 116c may be the same as or different from the inductance of the output attenuation circuit 136c. The capacitance of the input attenuation circuit 116c may be the same as or different from the capacitance of the output attenuation circuit 136c. The resistance of the resistor $R_1$ of the input attenuation circuit 116c may be the same as or different from the resistance of the resistor $R_1$ of the output attenuation circuit 136c. The resistance of the resistor $R_2$ of the input attenuation circuit 116c may be the same as or different from the resistance of the resistor $R_2$ of the output attenuation circuit 136c. The magnitude $|Z_2|$ of the impedance of the input attenuation circuit 116c may be the same as or different from the magnitude $|Z_2|$ of the impedance of the output attenuation circuit 136c. The frequency at which the magnitude $|Z_2|$ of the impedance of the input attenuation circuit 116c becomes minimum may be the same as or different from the frequency at which the magnitude $|Z_2|$ of the impedance of the output attenuation circuit 136c becomes the minimum. The degree to which the gain for the input signal is attenuated by the input attenuation circuit 116c may be the same as or different from the degree to which the gain for the input signal is attenuated by the output attenuation circuit 136c.

Figure 8D:
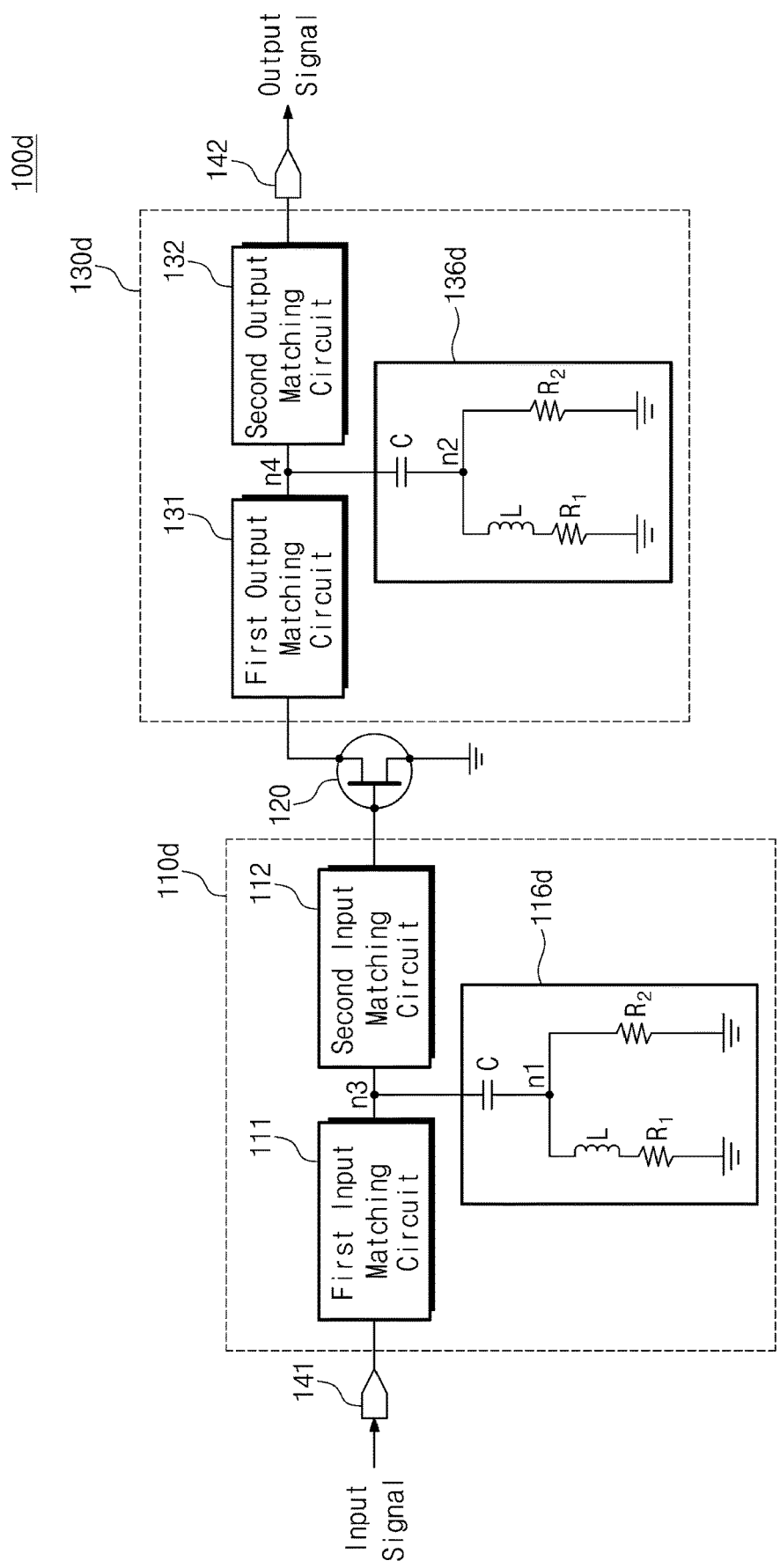

A difference between the amplification circuit 100d in FIG. 8D and the amplification circuit 100b in FIG. 8B will be mainly described. An input stage 110d may include the input attenuation circuit 116d instead of the input attenuation circuit 116b. An output stage 130d may include an output attenuation circuit 136d instead of the output attenuation circuit 136b. Each of the input attenuation circuit 116d and the output attenuation circuit 136d may be the attenuation circuit 116d of FIG. 4. The input attenuation circuit 116d may provide the above-described impedance $Z_3$ to the input signal that passes through the node n3 or the first input matching circuit 111. The output attenuation circuit 136d may provide the above-described impedance $Z_3$ to the amplified signal that passes through the node n4 or the first output matching circuit 131. The input attenuation circuit 116d and the output attenuation circuit 136d may attenuate the gain for the input signal outside the operating frequency band of the amplification circuit 100d, respectively. The amplification circuit 100d may attenuate the gain for the input signal to a maximum at a frequency at which the magnitude $|Z_3|$ of the impedance of the input attenuation circuit 116d becomes minimum, and the amplification circuit 100d may attenuate the gain of the input signal to a maximum at the frequency at which the magnitude $|Z_3|$ of the impedance of the output attenuation circuit 136d becomes minimum.

In an embodiment, the inductance of the input attenuation circuit 116d may be the same as or different from the inductance of the output attenuation circuit 136d. The capacitance of the input attenuation circuit 116d may be the same as or different from the capacitance of the output attenuation circuit 136d. The resistance of the resistor $R_1$ of the input attenuation circuit 116d may be the same as or different from the resistance of the resistor $R_1$ of the output attenuation circuit 136d. The resistance of the resistor $R_2$ of the input attenuation circuit 116d may be the same as or different from the resistance of the resistor $R_2$ of the output attenuation circuit 136d. The magnitude $|Z_3|$ of the impedance of the input attenuation circuit 116d may be the same as or different from the magnitude $|Z_3|$ of the impedance of the output attenuation circuit 136d. The frequency at which the magnitude $|Z_3|$ of the impedance of the input attenuation circuit 116d becomes minimum may be the same as or different from the frequency at which the magnitude $|Z_3|$ of the impedance of the output attenuation circuit 136d becomes the minimum. The degree to which the gain for the input signal is attenuated by the input attenuation circuit 116d may be the same as or different from the degree to which the gain for the input signal is attenuated by the output attenuation circuit 136d.

Figure 8E:
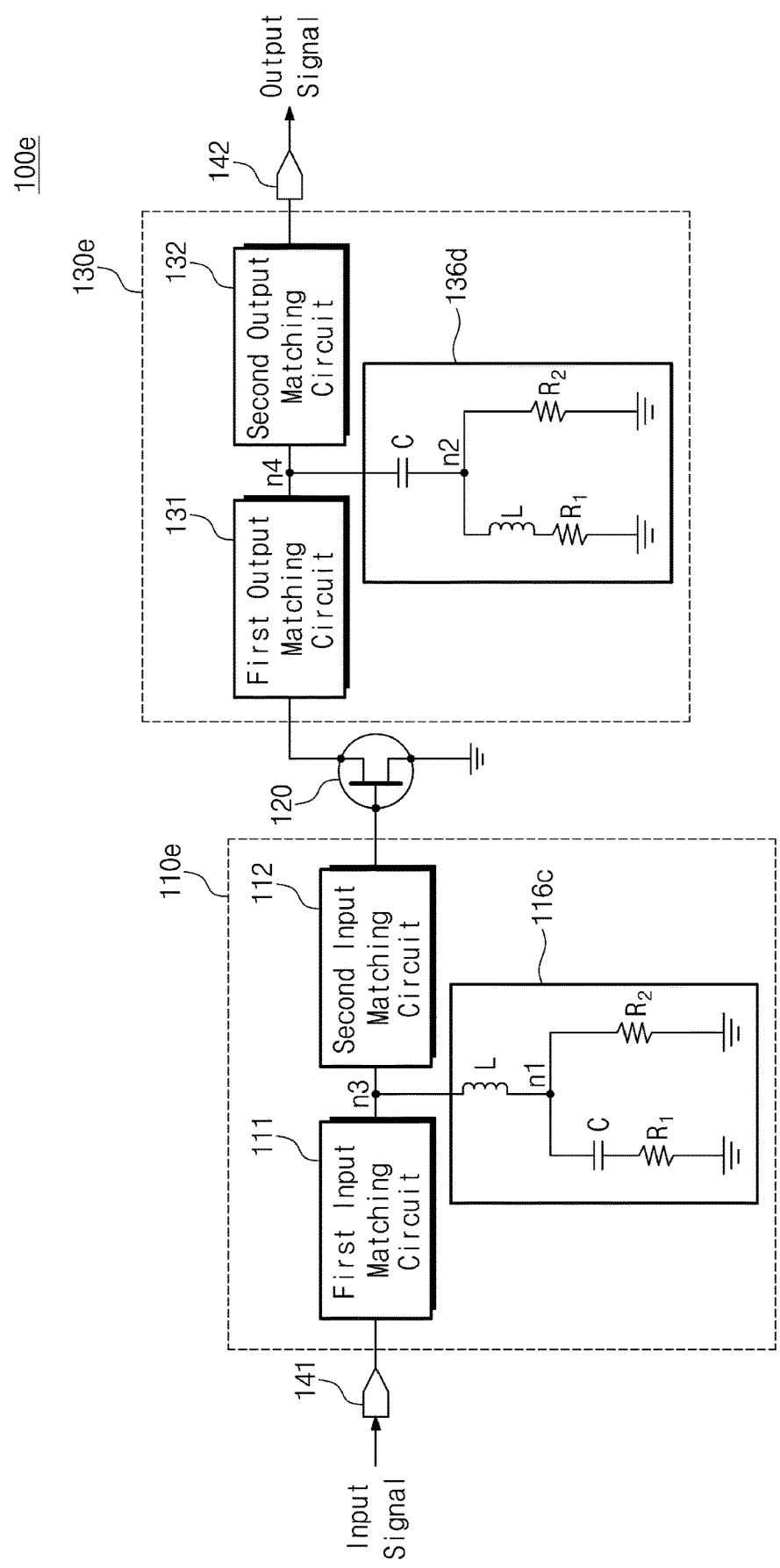

A difference between the amplification circuit 100e of FIG. 8E and the amplification circuit 100b of FIG. 8B will be mainly described. An input stage 110e may include the input attenuation circuit 116c instead of the input attenuation circuit 116b. An output stage 130e may include the output attenuation circuit 136d instead of the output attenuation circuit 136b. The input attenuation circuit 116c may be the attenuation circuit 116c of FIG. 3, and the output attenuation circuit 136d may be the attenuation circuit 116d of FIG. 4. The input attenuation circuit 116c may provide the above-described impedance $Z_2$ to the input signal that passes through the node n3 or the first input matching circuit 111. The output attenuation circuit 136d may provide the above-described impedance $Z_3$ to the amplified signal that passes through the node n4 or the first output matching circuit 131. The input attenuation circuit 116c and the output attenuation circuit 136d may attenuate the gain for the input signal outside the operating frequency band of the amplification circuit 100e, respectively. The amplification circuit 100e may attenuate the gain for the input signal to a maximum at the frequency at which the magnitude $|Z_2|$ of the impedance of the input attenuation circuit 116c becomes minimum, and the amplification circuit 100e may attenuate the gain of the input signal to a maximum at the frequency at which the magnitude $|Z_3|$ of the impedance of the output attenuation circuit 136d becomes minimum.

In an embodiment, the inductance, the capacitance, and the resistance of the input attenuation circuit 116c may be set to various values. The inductance, capacitance, and resistance of the output attenuation circuit 136d may be set to various values. The magnitude $|Z_2|$ of the impedance of the input attenuation circuit 116c may be the same as or different from the magnitude $|Z_3|$ of the impedance of the output attenuation circuit 136d. The frequency at which the magnitude $|Z_2|$ of the impedance of the input attenuation circuit 116c becomes the minimum may be the same as or different from the frequency at which the magnitude $|Z_3|$ of the impedance of the output attenuation circuit 136d is the minimum. The degree to which the gain for the input signal is attenuated by the input attenuation circuit 116c may be the same as or different from the degree to which the gain for the input signal is attenuated by the output attenuation circuit 136d.

Figure 8F:
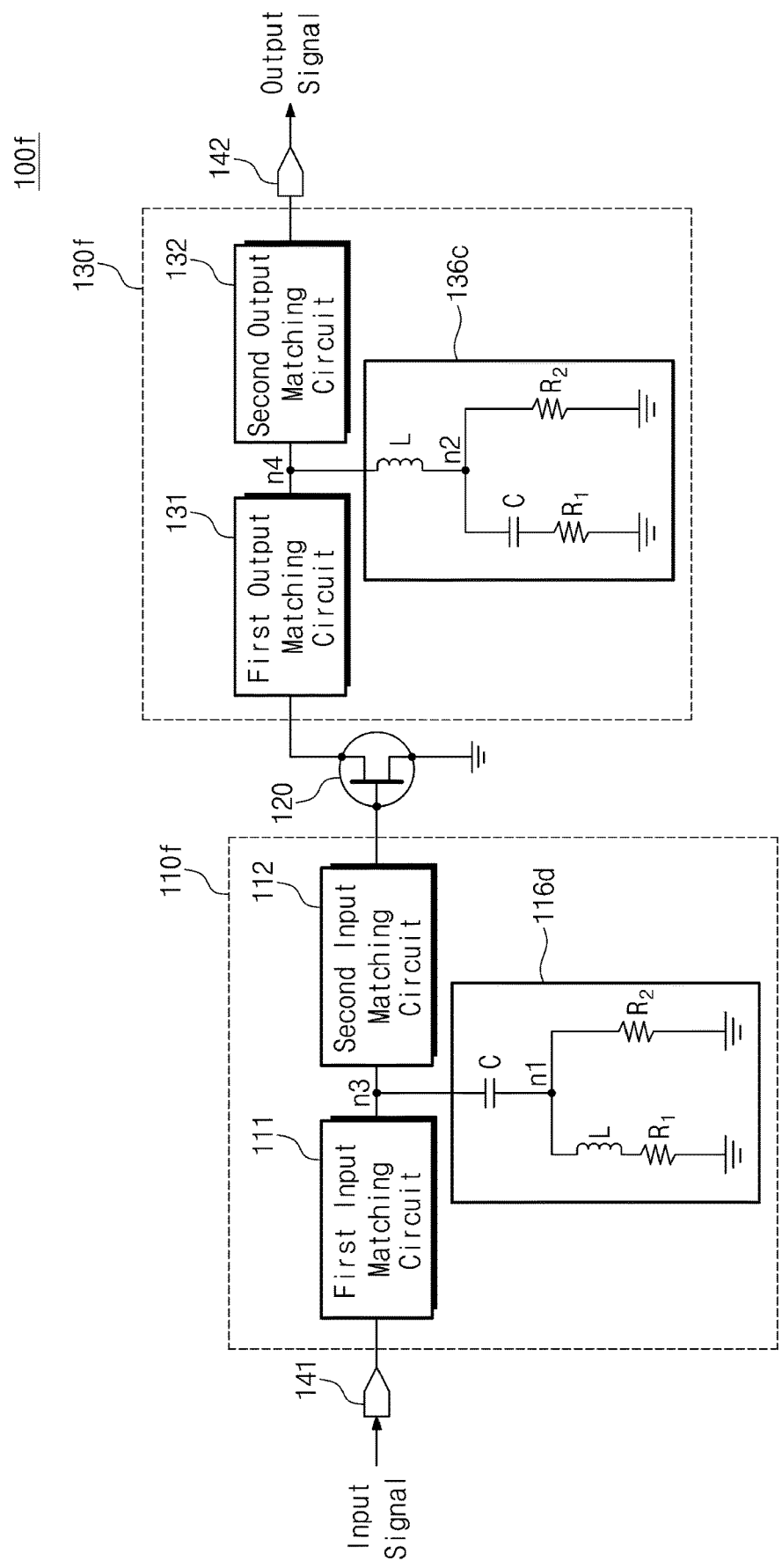

A difference between the amplification circuit 100f of FIG. 8F and the amplification circuit 100b of FIG. 8B will be mainly described. An input stage 110f may include the input attenuation circuit 116d instead of the input attenuation circuit 116b. An output stage 130f may include the output attenuation circuit 136c instead of the output attenuation circuit 136b. The input attenuation circuit 116d may be the attenuation circuit 116d of FIG. 4, and the output attenuation circuit 136c may be the attenuation circuit 116c of FIG. 3. The input attenuation circuit 116d may provide the above-described impedance $Z_3$ to the input signal that passes through the node n3 or the first input matching circuit 111. The output attenuation circuit 136c may provide the above-described impedance $Z_2$ to the amplified signal that passes through the node n4 or the first output matching circuit 131. The input attenuation circuit 116d and the output attenuation circuit 136c may attenuate the gain for the input signal outside the operating frequency band of the amplification circuit 100f, respectively. The amplification circuit 100f may attenuate the gain for the input signal to a maximum at the frequency at which the magnitude $|Z_3|$ of the impedance of the input attenuation circuit 116d becomes minimum. The amplification circuit 100f may attenuate the gain of the input signal to a maximum at the frequency at which the magnitude $|Z_2|$ of the impedance of the output attenuation circuit 136c becomes minimum.

In an embodiment, the inductance, the capacitance, and the resistance of the input attenuation circuit 116d may be set to various values. The inductance, the capacitance, and the resistance of the output attenuation circuit 136c may be set to various values. The magnitude $|Z_3|$ of the impedance of the input attenuation circuit 116d may be the same as or different from the magnitude $|Z_2|$ of the impedance of the output attenuation circuit 136c. The frequency at which the magnitude $|Z_3|$ of the impedance of the input attenuation circuit 116d becomes minimum may be the same as or different from the frequency at which the magnitude $|Z_2|$ of the impedance of the output attenuation circuit 136c becomes minimum. The degree to which the gain for the input signal is attenuated by the input attenuation circuit 116d may be the same as or different from the degree to which the gain for the input signal is attenuated by the output attenuation circuit 136c.

Figure 8G:
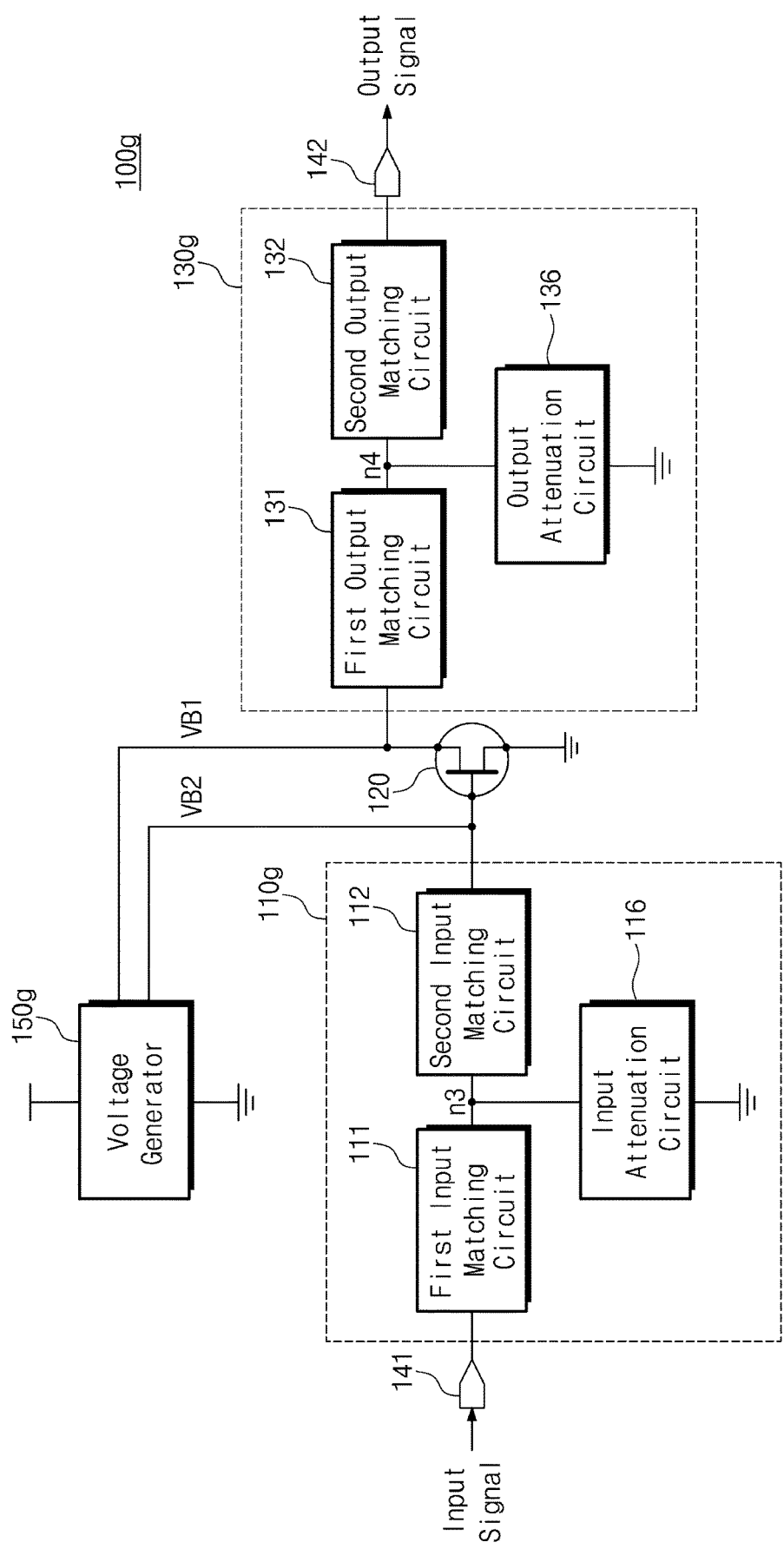

A difference among the amplification circuit 100g of FIG. 8G and the amplification circuits 100b to 100f of FIGS. 8B to 8F will be mainly described. An input stage 110g may be one of the input stages 110b to 110f. An output stage 130g may be one of the output stages 130b to 130f. The amplification circuit 100g may further include a voltage generator 150g. The voltage generator 150g may be supplied with a power supply voltage and the ground voltage, and may generate bias voltages VB1 and VB2, based on the power supply voltage and the ground voltage. The voltage generator 150g may supply the bias voltage VB1 to a terminal of a transistor that is connected to the first output matching circuit 131. The voltage generator 150g may supply the bias voltage VB2 to a terminal of a transistor that is connected to the second input matching circuit 112. Although not illustrated, the voltage generator 150g may further supply various bias voltages to arbitrary nodes (e.g., n1 to n4, etc.) of the amplification circuit 100g.

Figure 9A:
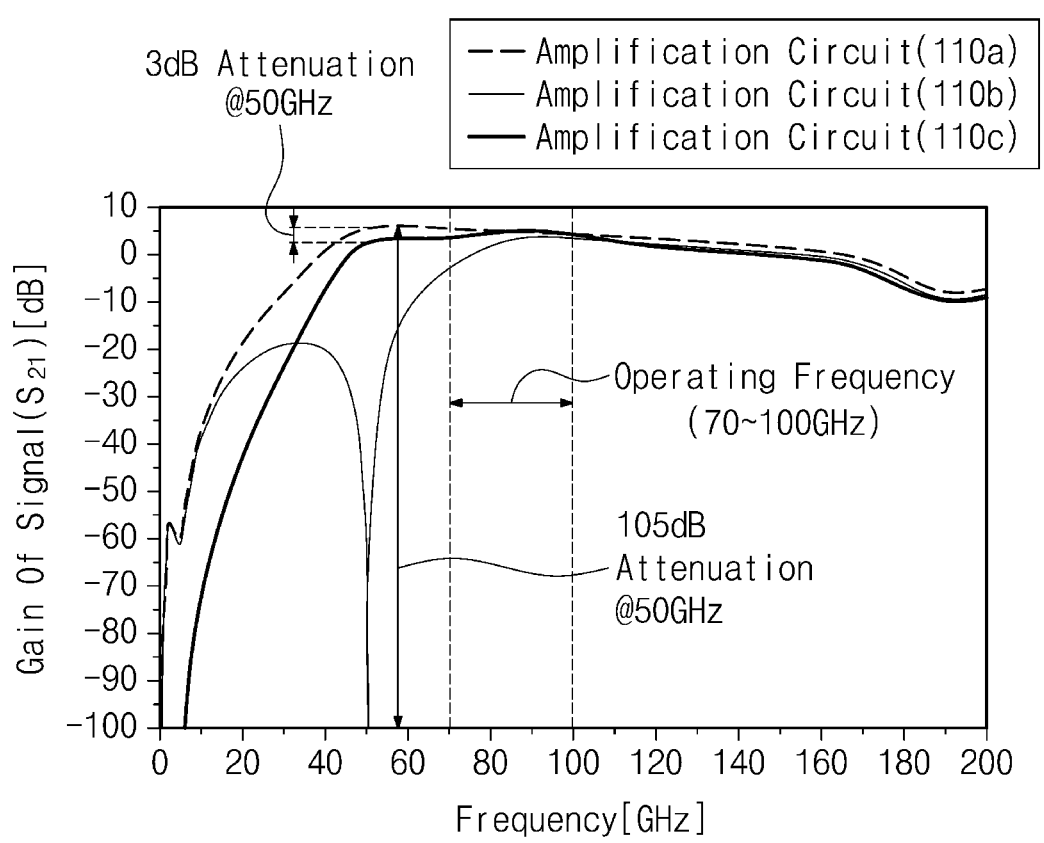
FIGS. 9A and 9B are graphs illustrating gains for input signals by amplification circuits of FIGS. 8A to 8C.
Figure 9B:
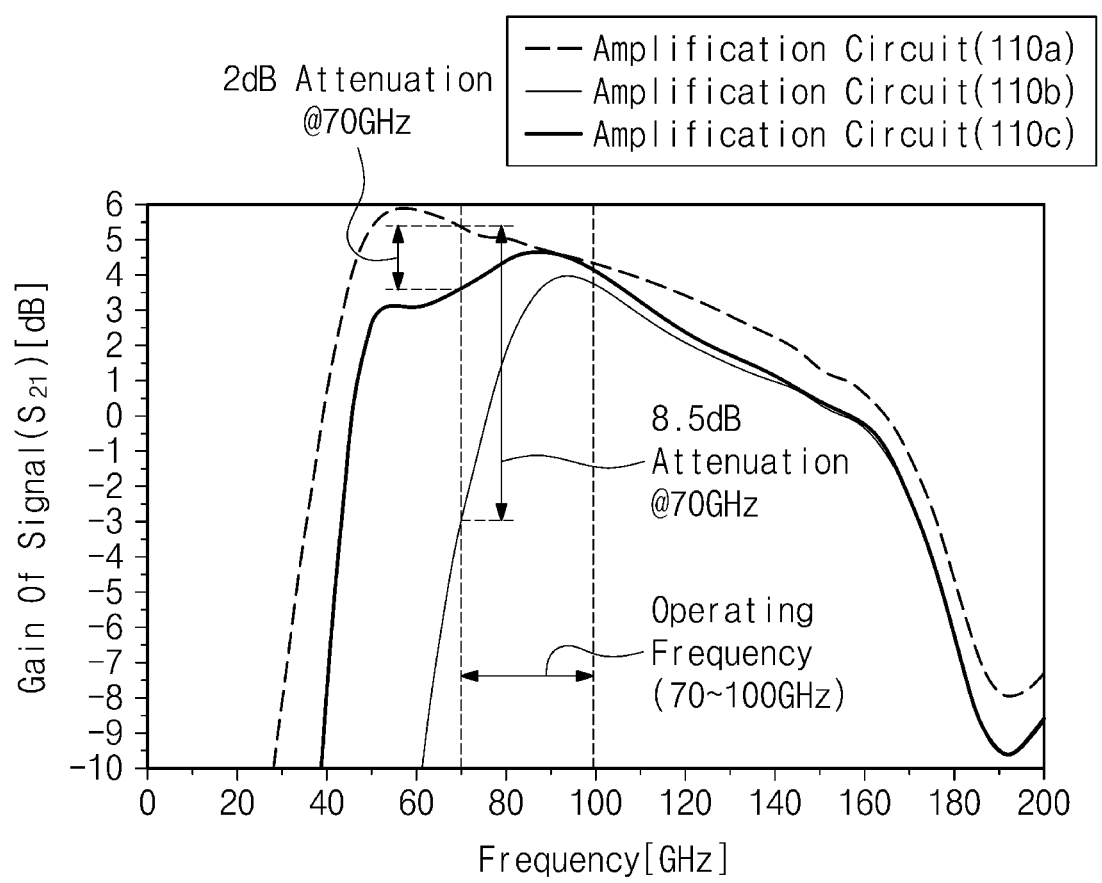

FIGS. 9A and 9B are graphs illustrating gains for input signals by amplification circuits of FIGS. 8A to 8C. A horizontal axis may represent a frequency, and a vertical axis may represent a gain in dB. In FIG. 9A, a range of the gain corresponds to −100 to 10 dB, and in FIG. 9B, a range of the gain corresponds to −10 to 6 dB.

In FIG. 9A and FIG. 9B, the operating frequency range of the amplification circuits 100a to 100c may be 70 to 100 GHz. The amplification circuit 100a may have the gain of about 4.3 to 5.5 dB within the operating frequency range. The amplification circuit 100a may have a gain of about 6 dB at a frequency of 50 GHz that is located outside the operating frequency range. The amplification circuit 100a may have a gain of about 0.5 to 1.7 dB greater than the gain within the operating frequency range at a frequency of 50 GHz. This is because the transistor of the amplifier 120, which is an active element, exhibits a relatively high gain at a relatively low frequency and a relatively low gain at a relatively high frequency. The gain for the input signal outside the operating frequency range is an undesired gain, which may cause deterioration of the communication system and additional circuitry such as filters. Various attenuation circuits described above in FIGS. 2 to 8G may be used to attenuate the gain for the input signal outside the operating frequency range.

The amplification circuit 100b may include the input attenuation circuit 116b and the output attenuation circuit 136b. The amplification circuit 100b may attenuate the gain by about 105 dB at a frequency of 50 GHz compared to the amplification circuit 100a by using the input attenuation circuit 116b and the output attenuation circuit 136b. Since the input attenuation circuit 116b and the output attenuation circuit 136b do not include the resistors $R_1$ and $R_2$, the degree (about 105 dB) to which the gain for the input signal is attenuated outside the operating frequency range may not be adjusted. As the gain is rapidly attenuated at a frequency of 50 GHz, the input attenuation circuit 116b and the output attenuation circuit 136b may attenuate the gain even within the operating frequency range. The amplification circuit 100b may attenuate the gain by about 8.5 dB at a frequency of 70 GHz compared to the amplification circuit 100a.

The amplification circuit 100c may include the input attenuation circuit 116c and the output attenuation circuit 136c. The amplification circuit 100c may attenuate the gain by about 3 dB at a frequency of 50 GHz compared to the amplification circuit 100a by using the input attenuation circuit 116c and the output attenuation circuit 136c. Since the input attenuation circuit 116c and the output attenuation circuit 136c include the resistors $R_1$ and $R_2$, the degree to which the gain of the input signal is attenuated outside the operating frequency range may be adjusted (i.e., adjusted from 105 dB attenuation to 3 dB attenuation). The amplification circuit 100c may attenuate the gain by about 2 dB at a frequency of 70 GHz compared to the amplification circuit 100a, but the amplification circuit 100c may have a gain of about 3.5 to 4.5 dB within the operating frequency range similar to the amplification circuit 100a. The amplification circuit 100c may adjust the degree of attenuating the gain outside the operating frequency range by using the input attenuation circuit 116c and the output attenuation circuit 136c. As at least one of the resistances of the resistors $R_1$ and $R_2$ of the input attenuation circuit 116c and the output attenuation circuit 136c is adjusted, the degree to which the gain in the operating frequency range is attenuated may be minimized, and the gain outside the operating frequency range may be made less than the gain within the operating frequency range. Other amplification circuits 100d to 100f not illustrated in FIGS. 9A and 9B may also have aforementioned advantages of the amplification circuit 100c.

In FIGS. 9A and 9B, various values are given by way of example, but the scope of the inventive concept is not limited to the above-described values.

Figure 10:
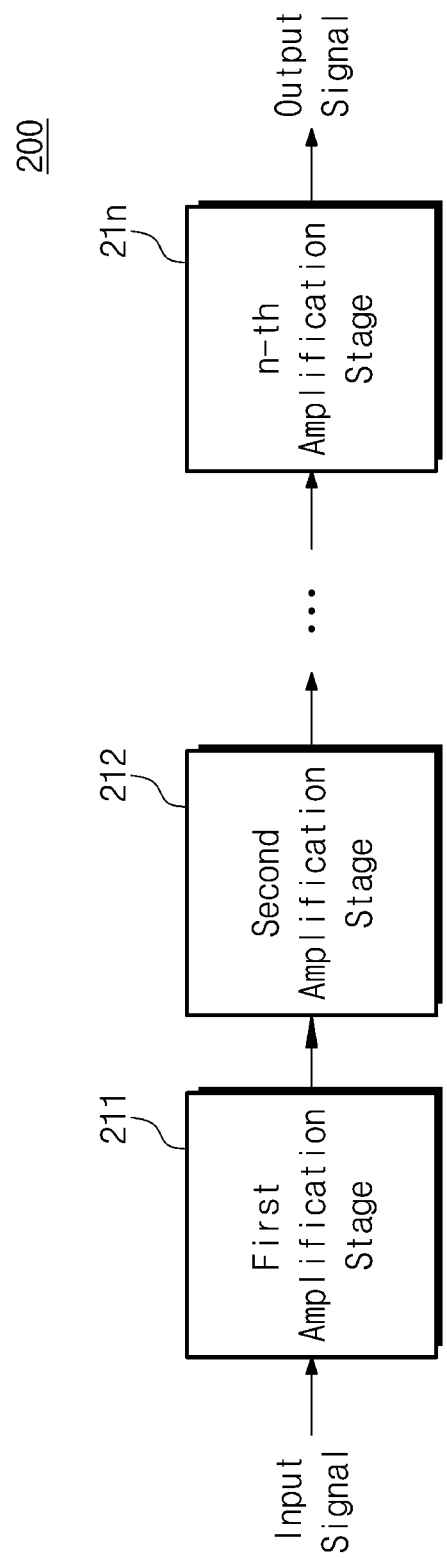
FIG. 10 is an exemplary block diagram of an amplification circuit according to another embodiment of the inventive concept.

FIG. 10 is an exemplary block diagram of an amplification circuit according to another embodiment of the inventive concept. An amplification circuit 200 may include first to n-th amplification stages 211 to 21n (where "n" is a natural number of 2 or more). The first amplification stage 211 may receive the input signal, and the n-th amplification stage 21n may output the amplified signal as the output signal. In FIG. 1 to FIG. 9B, the amplification circuit 100 is described as one stage, but as illustrated in FIG. 10, the amplification circuit 200 may include multiple stages.

In an embodiment, each of the first to n-th amplification stages 211 to 21n may include the input stage 110, the amplifier 120, and the output stage 130 described above with reference to FIGS. 1 to 9B. In another embodiment, the first amplification stage 211 may include only the input stage 110 and the amplifier 120 described above with reference to FIGS. 1 to 9B. The second amplification stage 212 may include only the amplifier 120 described above with reference to FIGS. 1 to 9B. The n-th amplification stage 21n may include only the amplifier 120 and the output stage 130 described above with reference to FIGS. 1 to 9B. Matching circuits (refer to circuits 111, 112, 131, and 132 in FIGS. 1 to 9B) may not be disposed among the first to n-th amplification stages 211 to 21n, or one or more matching circuits may be disposed.

Figure 11:
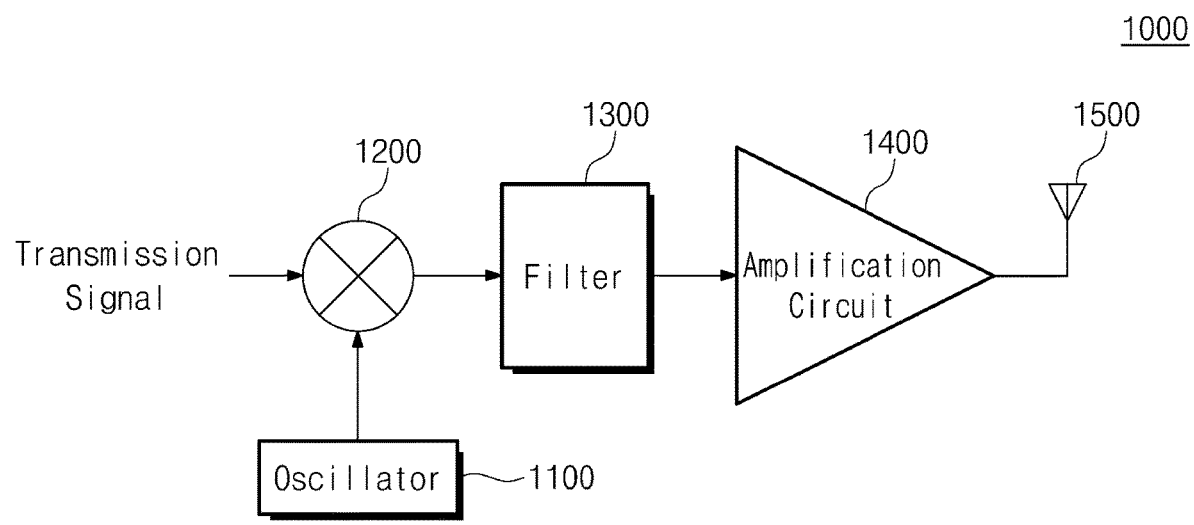
FIG. 11 is an exemplary block diagram of a transmitter to which an amplification circuit according to an embodiment of the inventive concept is applied.

FIG. 11 is an exemplary block diagram of a transmitter to which an amplification circuit according to an embodiment of the inventive concept is applied. A transmitter 1000 may include an oscillator 1100, a mixer 1200, a filter 1300, an amplification circuit 1400, and an antenna 1500.

The oscillator 1100 may generate a frequency for frequency synthesis and may provide the frequency to the mixer 1200. The mixer 1200 may convert a transmission signal of the intermediate frequency (IF) band into a signal of a high frequency band or an RF band by using the frequency that is provided from the oscillator 1100 (frequency up-conversion). The filter 1300 may perform a filtering operation on the signal converted by the mixer 1200 to pass only a desired frequency component. The amplification circuit 1400 as a driving amplifier or a power amplifier may amplify a signal that passes through the filter 1300. For example, the amplification circuit 1400 may include the amplification circuit 100 and/or 200 described above with reference to FIGS. 1 to 10. The antenna 1500 may receive the amplified signal from the amplification circuit 1400, may convert the received signal into an electromagnetic wave signal, and may output the electromagnetic wave signal.

Figure 12:
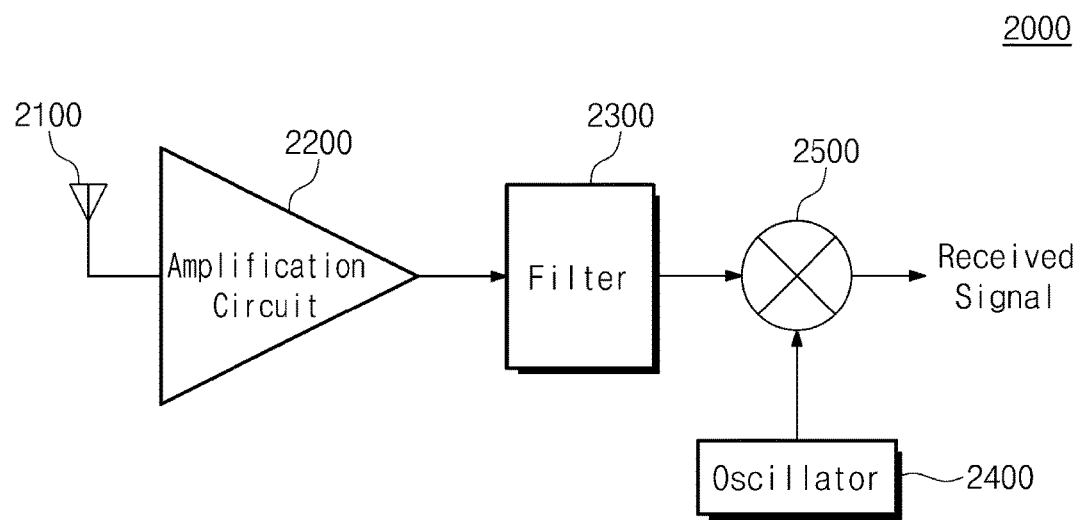
FIG. 12 is an exemplary block diagram of a receiver to which an amplification circuit according to an embodiment of the inventive concept is applied.

FIG. 12 is an exemplary block diagram of a receiver to which an amplification circuit according to an embodiment of the inventive concept is applied. A receiver 2000 may include an antenna 2100, an amplification circuit 2200, a filter 2300, an oscillator 2400, and a mixer 2500.

The antenna 2100 may receive the electromagnetic wave signal, may convert the received signal into an electrical signal, and may provide the converted signal to the amplification circuit 2200. The amplification circuit 2200 as a low noise amplifier may amplify a signal provided from the antenna 2100. For example, the amplification circuit 2200 may include the amplification circuit 100 and/or 200 described above with reference to FIGS. 1 to 10. The filter 2300 may perform a filtering operation on the signal amplified by the amplification circuit 2200 to pass only a desired frequency component. The oscillator 2400 may generate a frequency for frequency synthesis and may provide the frequency to the mixer 2500. The mixer 2500 may convert a frequency band of a signal that passes through the filter 2300 into an intermediate frequency (IF) band by using the frequency that is provided from the oscillator 2400 (frequency down-conversion). The mixer 2500 may output the converted signal as a received signal.

Figure 13:
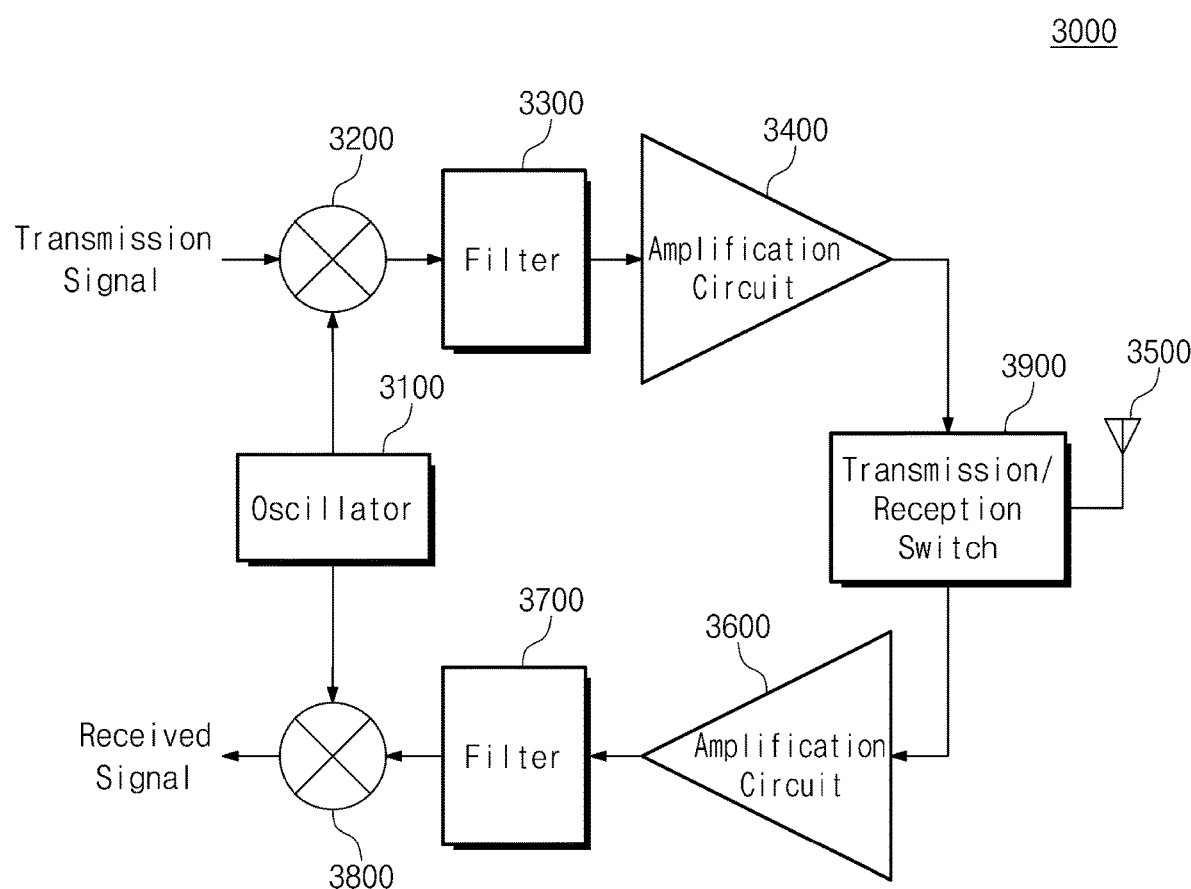
FIG. 13 is an exemplary block diagram of a transceiver to which an amplification circuit according to an embodiment of the inventive concept is applied.

FIG. 13 is an exemplary block diagram of a transceiver to which an amplification circuit according to an embodiment of the inventive concept is applied. A transceiver 3000 may include an oscillator 3100, a mixer 3200, a filter 3300, an amplification circuit 3400, an antenna 3500, an amplification circuit 3600, a filter 3700, a mixer 3800, and a transmission/reception switch 3900.

The oscillator 3100, the mixer 3200, the filter 3300, the amplification circuit 3400, and the antenna 3500 may be similar to the oscillator 1100, the mixer 1200, the filter 1300, the amplification circuit 1400, and the antenna 1500 that are illustrated in FIG. 11, respectively. The antenna 3500, the amplification circuit 3600, the filter 3700, the oscillator 3100, and the mixer 3800 may be similar to the antenna 2100, the amplification circuit 2200, the filter 2300, and the oscillator 2400, and mixer 2500 that are illustrated in FIG. 12, respectively. The oscillator 3100 may generate a frequency used by the mixer 3200 and a frequency used by the mixer 3800, respectively, or may generate the frequency in common when both are the same. The antenna 3500 may convert a signal amplified by the amplification circuit 3400 into an electromagnetic wave signal and may output the signal, or may receive an electromagnetic wave signal and may provide the received signal to the amplification circuit 3600. The transmission/reception switch 3900 may be connected to the antenna 3500. The transmission/reception switch 3900 may branch a transmitter including the oscillator 3100, the mixer 3200, the filter 3300, and the amplification circuit 3400 and a receiver including the amplification circuit 2200, the filter 2300, the oscillator 2400, and the mixer 2500. The transmission/reception switch 3900 may include a filter that passes the frequency of the transmitter and a filter that passes the frequency of the receiver.

According to an embodiment of the inventive concept, a microwave amplification circuit capable of adjusting a degree of attenuation of a gain for an input signal may be provided.

The contents described above are specific embodiments for implementing the inventive concept. The inventive concept may include not only the embodiments described above but also embodiments in which a design is simply or easily capable of being changed. In addition, the inventive concept may also include technologies easily changed to be implemented using embodiments.

What is claimed is:

1. An amplification circuit for amplifying an input signal comprising:
   an input stage including an input matching circuit configured to receive the input signal and an input attenuation circuit configured to attenuate a gain for the input signal outside an operating frequency band of the amplification circuit;
   a transistor configured to amplify the input signal provided from the input stage; and
   an output stage including an output matching circuit configured to receive a signal amplified by the transistor and an output attenuation circuit configured to attenuate the gain for the input signal outside the operating frequency band of the amplification circuit, and
   wherein the input attenuation circuit includes a first resistor and a second resistor that are respectively connected to a ground voltage, a first passive element connected between the input matching circuit and the second resistor, and a second passive element connected between the first passive element and the first resistor, and
   wherein the first passive element is one of an inductor and a capacitor, and the second passive element is another one of the inductor and the capacitor.

2. The amplification circuit of claim 1, wherein the output attenuation circuit includes a third resistor and a fourth resistor that are respectively connected to the ground voltage, a third passive element connected between the output matching circuit and the fourth resistor, and a fourth passive element connected between the third passive element and the third resistor, and
   wherein the third passive element is one of the inductor and the capacitor, and the fourth passive element is another one of the inductor and the capacitor.

3. The amplification circuit of claim 2, wherein the first resistor and the second passive element which are connected in series with each other and the second resistor are connected in parallel between the ground voltage and the first passive element, and
   wherein the third resistor and the fourth passive element which are connected in series with each other and the fourth resistor are connected in parallel between the ground voltage and the third passive element.

4. The amplification circuit of claim 2, wherein a first frequency at which the input attenuation circuit has a first minimum impedance is adjusted by the first passive element, the second passive element, the first resistor, and the second resistor, and
   wherein a second frequency at which the output attenuation circuit has a second minimum impedance is adjusted by the third passive element, the fourth passive element, the third resistor, and the fourth resistor.

5. The amplification circuit of claim 4, wherein the input attenuation circuit is configured to attenuate the gain for the input signal at the first frequency to a maximum, and
   wherein the output attenuation circuit is configured to attenuate the gain for the input signal at the second frequency to a maximum.

6. The amplification circuit of claim 4, wherein a first resonance frequency of the input attenuation circuit is different from the first frequency, and
   wherein a second resonance frequency of the output attenuation circuit is different from the second frequency.

7. The amplification circuit of claim 2, wherein the input matching circuit is a first input matching circuit,
   wherein the output matching circuit is a first output matching circuit,
   wherein the input stage further includes a second input matching circuit connected between the first input matching circuit and the transistor, and
   wherein the output stage further includes a second output matching circuit connected to both the first output matching circuit and the output attenuation circuit.

8. The amplification circuit of claim 7, wherein the input attenuation circuit is connected between a first node that is connected to both the first input matching circuit and the second input matching circuit and the ground voltage, and
   wherein the output attenuation circuit is connected between a second node that is connected to both the first output matching circuit and the second output matching circuit and the ground voltage.

9. The amplification circuit of claim 1, wherein the transistor includes a first terminal connected to the input stage, a second terminal connected to the ground voltage, and a third terminal connected to the output stage.

10. An amplification circuit comprising:
    a first amplification stage that receives an input signal; and
    a second amplification stage connected in series with the first amplification stage, and
    wherein the first amplification stage includes:
    an input stage including an input matching circuit configured to receive the input signal and an input attenuation circuit configured to attenuate a gain for the input signal outside an operating frequency band of the amplification circuit; and
    a first transistor configured to amplify the input signal provided from the input stage,
    wherein the input attenuation circuit includes a first resistor and a second resistor connected respectively to a ground voltage, a first passive element connected between the input matching circuit and the second resistor, and a second passive element connected between the first passive element and the first resistor, and
    wherein the first passive element is one of an inductor and a capacitor, and the second passive element is another one of the inductor and the capacitor.

11. The amplification circuit of claim 10, wherein the second amplification stage includes a second transistor configured to amplify an intermediate signal that is provided from the first amplification stage.

12. The amplification circuit of claim 11, further comprising:
    a third amplification stage connected in series with the second amplification stage.

13. The amplification circuit of claim 11, wherein the second amplification stage further includes an output stage including an output matching circuit configured to receive a signal amplified by the second transistor and an output attenuation circuit configured to attenuate the gain for the input signal outside the operating frequency band of the amplification circuit.

14. The amplification circuit of claim 13, wherein the output attenuation circuit includes a third resistor and a fourth resistor connected respectively to the ground voltage, a third passive element connected between the output matching circuit and the fourth resistor, and a fourth passive element connected between the third passive element and the third resistor, and wherein the third passive element is one of the inductor and the capacitor, and the fourth passive element is another one of the inductor and the capacitor.

\* \* \* \* \*